US010468397B2

(12) United States Patent
Cok

(10) Patent No.: US 10,468,397 B2
(45) Date of Patent: Nov. 5, 2019

(54) MATRIX ADDRESSED TILES AND ARRAYS

(71) Applicant: X-Celeprint Limited, Cork (IE)

(72) Inventor: Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/971,662

(22) Filed: May 4, 2018

(65) Prior Publication Data

US 2018/0323180 A1 Nov. 8, 2018

Related U.S. Application Data

(60) Provisional application No. 62/502,521, filed on May 5, 2017.

(51) Int. Cl.
*H01L 25/16* (2006.01)
*H01L 25/04* (2014.01)
(Continued)

(52) U.S. Cl.
CPC ......... *H01L 25/167* (2013.01); *G09G 3/2014* (2013.01); *G09G 3/32* (2013.01);
(Continued)

(58) Field of Classification Search
CPC ...... G09G 2300/026; G09G 2300/0408; G02F 1/13336; H01L 27/3293
See application file for complete search history.

(56) References Cited

U.S. PATENT DOCUMENTS 5,563,470 A 10/1996 Li
5,889,568 A * 3/1999 Seraphim ............ G02F 1/1333
349/1
(Continued)

FOREIGN PATENT DOCUMENTS

EP 1548571 A1 6/2005
WO WO-2010/132552 A1 11/2010
WO WO-2014/149864 A1 9/2014

OTHER PUBLICATIONS

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.
(Continued)

*Primary Examiner* — Dong Hui Liang
(74) *Attorney, Agent, or Firm* — William R. Haulbrook; Michael D. Schmitt; Choate, Hall & Stewart LLP

(57) ABSTRACT

A matrix-addressed tile comprises a tile substrate having a two-dimensional array of pixels arranged in rows and columns defining a contiguous pixel area that includes all of the pixels. A one-dimensional array of column-data lines electrically connected to columns of pixels and a one-dimensional array of row-select lines connected to rows of pixels are disposed on the tile substrate at least partially in the pixel area. At least one column-data line contact pad electrically connected to each of the column-data lines and at least one row-select contact pad electrically connected to each of the row-select lines are disposed at least partially within the pixel area and between at least two pixels. A matrix-addressed tiled system includes two or more matrix-addressed tiles electrically connected through the column-data line contact pads and row-select line contact pads.

21 Claims, 21 Drawing Sheets

(51) Int. Cl.
*H01L 25/075* (2006.01)
*H01L 23/538* (2006.01)
*G09G 3/32* (2016.01)
*H01L 27/146* (2006.01)
*G09G 3/20* (2006.01)

(52) U.S. Cl.
CPC ........ *H01L 23/5386* (2013.01); *H01L 25/042* (2013.01); *H01L 25/0753* (2013.01); *H01L 27/14643* (2013.01); *G09G 2300/026* (2013.01); *G09G 2300/0408* (2013.01); *G09G 2300/0426* (2013.01); *G09G 2310/0232* (2013.01); *G09G 2310/0275* (2013.01); *G09G 2310/0286* (2013.01)

(56) References Cited

U.S. PATENT DOCUMENTS

| | | | |
|---|---|---|---|
| 6,142,358 | A | 11/2000 | Cohn et al. |
| 6,703,780 | B2 | 3/2004 | Shiang et al. |
| 6,853,411 | B2 | 2/2005 | Freidhoff et al. |
| 6,897,855 | B1 | 5/2005 | Matthies et al. |
| 6,999,045 | B2 | 2/2006 | Cok |
| 7,195,733 | B2 | 3/2007 | Rogers et al. |
| 7,354,801 | B2 | 4/2008 | Sugiyama et al. |
| 7,394,194 | B2 | 7/2008 | Cok |
| 7,521,292 | B2 | 4/2009 | Rogers et al. |
| 7,557,367 | B2 | 7/2009 | Rogers et al. |
| 7,622,367 | B1 | 11/2009 | Nuzzo et al. |
| 7,662,545 | B2 | 2/2010 | Nuzzo et al. |
| 7,704,684 | B2 | 4/2010 | Rogers et al. |
| 7,799,699 | B2 | 9/2010 | Nuzzo et al. |
| 7,932,123 | B2 | 4/2011 | Rogers et al. |
| 7,943,491 | B2 | 5/2011 | Nuzzo et al. |
| 7,972,875 | B2 | 7/2011 | Rogers et al. |
| 8,305,294 | B2 | 11/2012 | Cok et al. |
| 8,333,860 | B1 | 12/2012 | Bibl et al. |
| 8,506,867 | B2 | 8/2013 | Menard |
| 8,531,642 | B2 | 9/2013 | Kiryuschev et al. |
| 8,558,243 | B2 | 10/2013 | Bibl et al. |
| 8,722,458 | B2 | 5/2014 | Rogers et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,835,940 | B2 | 9/2014 | Hu et al. |
| 8,865,489 | B2 | 10/2014 | Rogers et al. |
| 8,877,648 | B2 | 11/2014 | Bower et al. |
| 8,889,485 | B2 | 11/2014 | Bower |
| 8,934,259 | B2 | 1/2015 | Bower et al. |
| 8,941,215 | B2 | 1/2015 | Hu et al. |
| 8,987,765 | B2 | 3/2015 | Bibl et al. |
| 9,049,797 | B2 | 6/2015 | Menard et al. |
| 9,105,714 | B2 | 8/2015 | Hu et al. |
| 9,111,464 | B2 | 8/2015 | Bibl et al. |
| 9,139,425 | B2 | 9/2015 | Vestyck |
| 9,153,171 | B2 | 10/2015 | Sakariya et al. |
| 9,161,448 | B2 | 10/2015 | Menard et al. |
| 9,165,989 | B2 | 10/2015 | Bower et al. |
| 9,166,114 | B2 | 10/2015 | Hu et al. |
| 9,178,123 | B2 | 11/2015 | Sakariya et al. |
| 9,217,541 | B2 | 12/2015 | Bathurst et al. |
| 9,240,397 | B2 | 1/2016 | Bibl et al. |
| 9,252,375 | B2 | 2/2016 | Bibl et al. |
| 9,355,854 | B2 | 5/2016 | Meitl et al. |
| 9,358,775 | B2 | 6/2016 | Bower et al. |
| 9,367,094 | B2 | 6/2016 | Bibl et al. |
| 9,412,727 | B2 | 8/2016 | Menard et al. |
| 9,478,583 | B2 | 10/2016 | Hu et al. |
| 9,484,504 | B2 | 11/2016 | Bibl et al. |
| 9,520,537 | B2 | 12/2016 | Bower et al. |
| 9,555,644 | B2 | 1/2017 | Rogers et al. |
| 9,583,533 | B2 | 2/2017 | Hu et al. |
| 9,589,944 | B2 | 3/2017 | Higginson et al. |
| 9,601,356 | B2 | 3/2017 | Bower et al. |
| 9,626,908 | B2 | 4/2017 | Sakariya et al. |
| 9,640,715 | B2 | 5/2017 | Bower et al. |
| 9,716,082 | B2 | 7/2017 | Bower et al. |
| 9,741,785 | B2 | 8/2017 | Bower et al. |
| 9,761,754 | B2 | 9/2017 | Bower et al. |
| 9,765,934 | B2 | 9/2017 | Rogers et al. |
| 9,865,832 | B2 | 1/2018 | Bibl et al. |
| 9,928,771 | B2 | 3/2018 | Cok |
| 9,929,053 | B2 | 3/2018 | Bower et al. |
| 10,157,563 | B2 | 12/2018 | Cok et al. |
| 10,181,507 | B2 | 1/2019 | Bower et al. |
| 2003/0117369 | A1 | 6/2003 | Spitzer et al. |
| 2003/0141570 | A1 | 7/2003 | Chen et al. |
| 2004/0180476 | A1 | 9/2004 | Kazlas et al. |
| 2006/0044215 | A1 | 3/2006 | Brody et al. |
| 2006/0116046 | A1 | 6/2006 | Morley et al. |
| 2008/0024709 | A1* | 1/2008 | Moon ................ G09G 3/3655 349/139 |
| 2008/0224254 | A1 | 9/2008 | Couillard et al. |
| 2009/0278141 | A1 | 11/2009 | Coe-Sullivan et al. |
| 2010/0207852 | A1 | 8/2010 | Cok |
| 2010/0213819 | A1* | 8/2010 | Cok ................ H01L 27/3255 313/498 |
| 2010/0258710 | A1 | 10/2010 | Wiese et al. |
| 2010/0264816 | A1* | 10/2010 | Cok ................ H01L 27/3255 313/506 |
| 2010/0306993 | A1 | 12/2010 | Mayyas et al. |
| 2010/0315319 | A1 | 12/2010 | Cok et al. |
| 2013/0309792 | A1 | 11/2013 | Tischler et al. |
| 2013/0316487 | A1 | 11/2013 | de Graff et al. |
| 2014/0104243 | A1 | 4/2014 | Sakariya et al. |
| 2014/0138543 | A1 | 5/2014 | LaVeigne |
| 2014/0159043 | A1 | 6/2014 | Sakariya et al. |
| 2014/0259634 | A1* | 9/2014 | Cox ................ G09F 27/008 29/592.1 |
| 2015/0028362 | A1 | 1/2015 | Chan et al. |
| 2016/0093600 | A1 | 3/2016 | Bower et al. |
| 2017/0061867 | A1 | 3/2017 | Cok et al. |
| 2017/0187976 | A1 | 6/2017 | Cok |
| 2017/0206845 | A1 | 7/2017 | Sakariya et al. |
| 2017/0330509 | A1 | 11/2017 | Cok et al. |
| 2017/0338374 | A1 | 11/2017 | Zou et al. |
| 2018/0197471 | A1 | 7/2018 | Rotzoll et al. |

OTHER PUBLICATIONS

Bower, C. A. et al., Transfer Printing: An Approach for Massively Parallel Assembly of Microscale Devices, IEEE, Electronic Components and Technology Conference, (2008).
Chesterfield, R. J. et al., 63.3:Multinozzle Printing: A Cost-effective Process for OLED Display Fabrication, SID 2009 Digest, vol. XL:Book II, 951-954.
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).

(56) References Cited

OTHER PUBLICATIONS

Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

\* cited by examiner

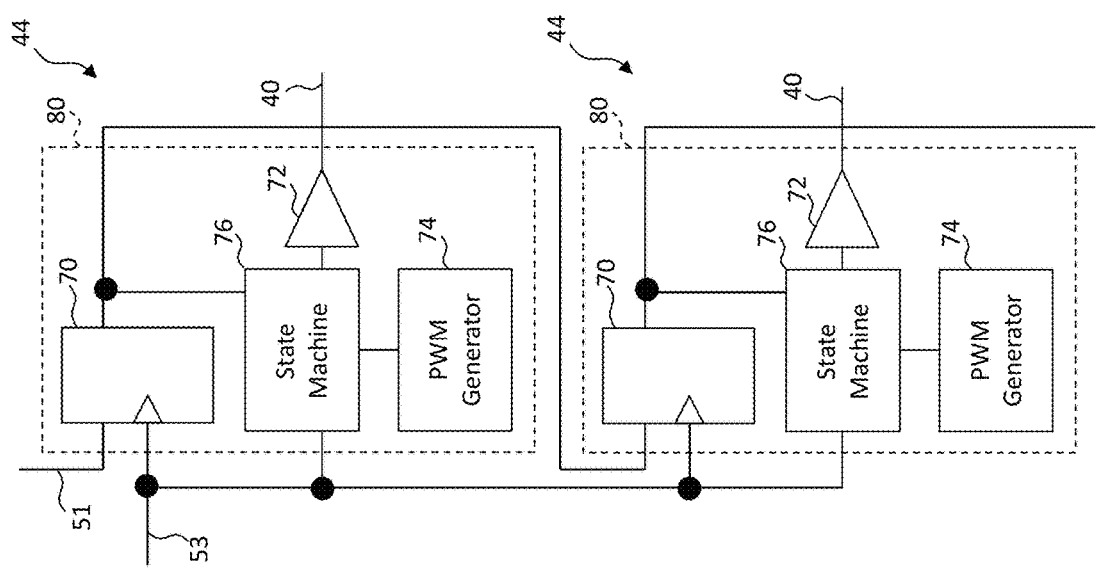

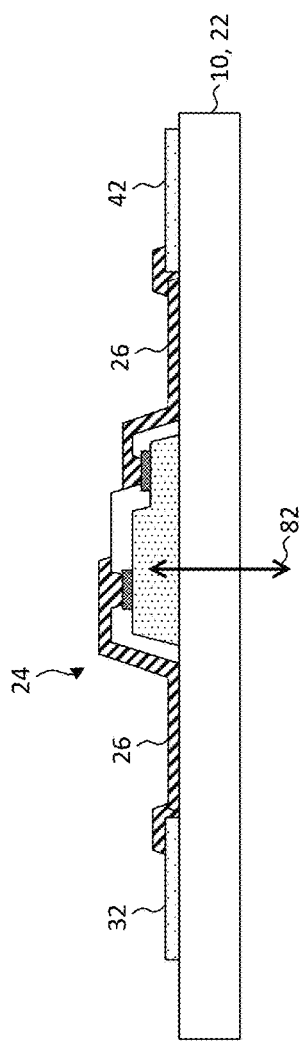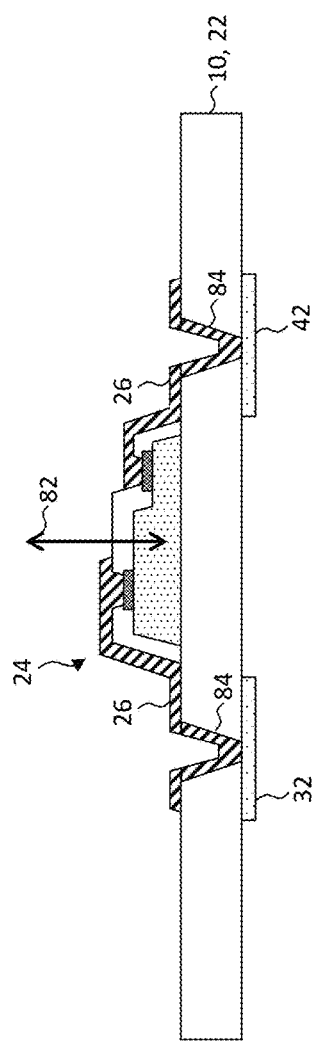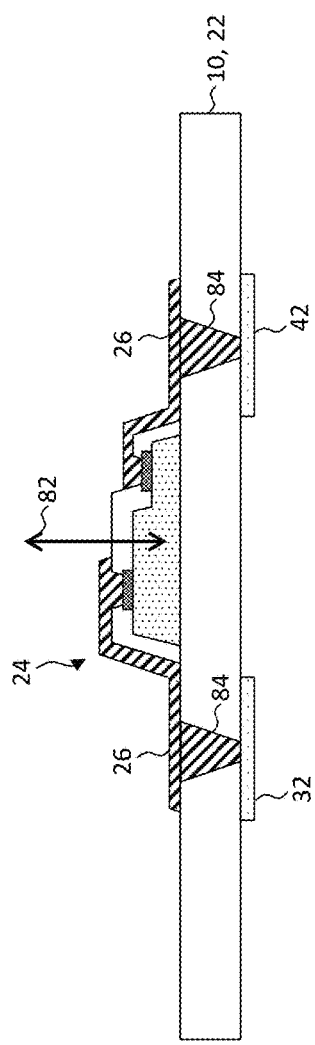

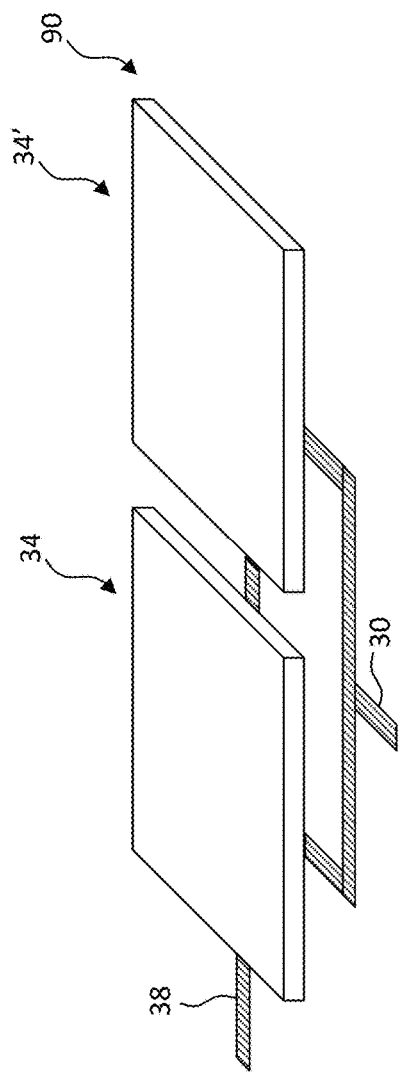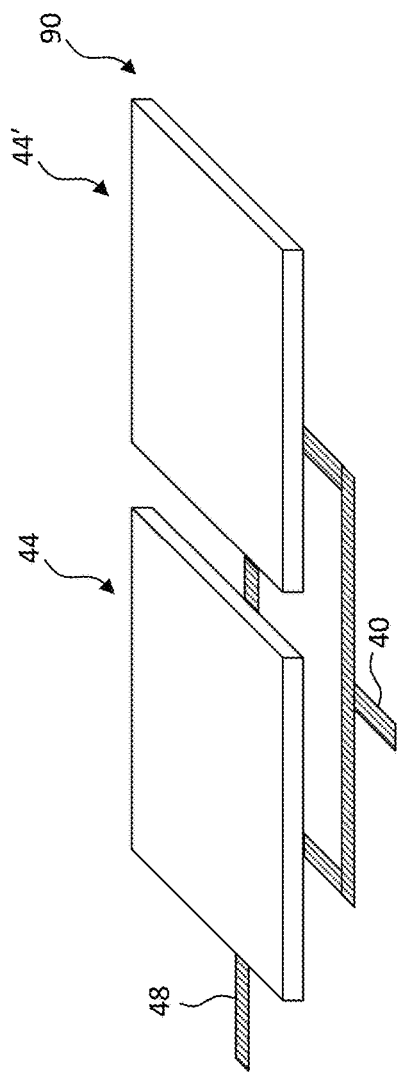
FIG. 12C
FIG. 12D

MATRIX ADDRESSED TILES AND ARRAYS

PRIORITY APPLICATION

This application claims the benefit of U.S. Provisional Patent Application No. 62/502,521, filed May 5, 2017, titled Matrix-Addressed Tile and Array, the content of which is hereby incorporated by reference herein in its entirety.

CROSS REFERENCE TO RELATED APPLICATIONS

Reference is made to U.S. patent application Ser. No. 14/835,282 filed Aug. 25, 2015, entitled Bit-Plane Pulse Width Modulated Digital Display System, by Cok et al., U.S. patent application Ser. No. 15/005,689, filed Jan. 25, 2016, entitled Distributed Pulse Width Modulation Control, by Cok, U.S. Provisional Patent Application No. 62/334,351, filed May 10, 2016, entitled Multi-Pixel Distributed Pulse Width Modulation Control, by Cok et al, U.S. Provisional patent application Ser. No. 15/003,721, filed Jan. 22, 2016, entitled Serial Row-Select Matrix-Addressed System, by Cok et al., U.S. Provisional patent application Ser. No. 15/416,678, filed Jan. 26, 2017, entitled Digital-Drive Pulse Width Modulated Display System, by Rotzoll et al., and U.S. Provisional patent application Ser. No. 15/476,684, filed Jan. 26, 2017, entitled Bit-Plane Pulse Width Modulated Digital Display System, by Cok et al., the contents of each of which are hereby incorporated by reference herein in their entirety.

TECHNICAL FIELD

The present invention relates generally to matrix-addressed systems such as flat-panel displays or area sensors. In particular, the present invention relates to control methods, devices, structures, and circuits for matrix-addressed tiled arrays.

BACKGROUND

Flat-panel displays are widely used in conjunction with computing devices, in portable devices, and for entertainment devices such as televisions. Such displays typically employ an array of pixels distributed in rows and columns over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television. Flat-panel electronic sensors having a plurality of pixel sensors are also available, for example for digital radiography.

Pixels in a display are typically arranged in an array of rows and columns and controlled through a matrix-addressing scheme in which rows of pixels are connected to a common row-select line and columns of pixel are connected to a common column-data line. By enabling a row of pixels and providing data on all of the column-data lines at the same time, all of the pixels in a row receive data at the same time. Each row of pixels is sequentially enabled to provide data to all of the display pixels in sequence. The row-select lines are typically controlled by a row controller and the column-data lines by a column controller. This arrangement, however, requires a separate electrical connection for each column and for each row. Thus, for an M×N pixel array, M+N electrical connections must be made to the array of pixels and generally to the substrate on which the flat-panel display is provided. For large displays, for example having thousands of rows and columns of pixels, the cost of connecting the pixel rows and columns can be significant.

Large-format displays, for example having a diagonal greater than 3 meters, are typically made with a two-dimensional array of tiles. Each tile includes a contiguous two-dimensional subset of the pixels in the display. Wires connect each tile to a system controller. The number of wires, interconnections, and the electronics to support each display tile are expensive and problematic. Alternatively, U.S. Pat. No. 6,999,045 discloses an electronic system for tiled displays that includes display tiles serially connected through communication interfaces and one display tile connected to a system controller. This approach requires high-performance integrated circuits distributed among the display tiles and is difficult to implement with conventional thin-film transistor (TFT) display backplanes, especially for high-resolution displays, since TFT circuits are large and have relatively low performance.

A significant and common problem for tiled displays are visible seams between the tiles that detract from the display image quality. Display tiles are typically butted together mechanically in a two-dimensional array and the supportive mechanical structures for the tiles can be visible and can also limit the resolution of the display. Moreover, as displays increase in resolution, the area between the pixels decreases, reducing the space at the edges of the display tiles for the supportive tile structures. Furthermore, electronic control circuitry to drive the pixels in a display (e.g., the row and column drivers) are typically located at two sides of the display area. Thus, simply arranging an array of conventional displays creates gaps between pixels at the edges of the display. U.S. Pat. No. 7,394,194 describes a tiled display with back-panel conductors that seeks to mitigate this problem by locating pixel control electronics behind the pixels. U.S. Patent Application Publication No. 2006/0044215 and U.S. Pat. No. 8,305,294 describe displays with overlapping tiles to obscure the electronic row and column driver circuitry. However, these approaches require a stacked layer structure and electrical connections between the layers.

Many large-format displays use inorganic light-emitting diodes (iLEDs) in the display pixels. However, such iLEDs are typically large and further limit the display resolution. Micro-LEDs are known that have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, and light-collecting semiconductor elements from a wafer substrate to a destination substrate such as a display substrate. However, even for smaller iLEDs, problems with electronic control and mechanical support remain for tiled displays.

There is a need therefore for system architectures that enable smaller, higher resolution, lower cost, and higher performance tiles in a matrix-addressed system.

SUMMARY

The present invention includes, inter alia, a matrix-addressed tile comprising a tile substrate, a two-dimensional array of pixels arranged in rows and columns disposed on the tile substrate, the array of pixels defining a contiguous pixel area of the tile substrate that includes all of the pixels in the array of pixels, a one-dimensional array of column-data lines disposed on the tile substrate at least partially in the pixel area, each column-data line electrically connected to the pixels in a column of pixels, a one-dimensional array of row-select lines disposed on the tile substrate at least partially in the pixel area, each row-select line electrically connected to the pixels in a row of pixels, at least one column-data line contact pad electrically connected to each of the column-data lines, each column-data line contact pad disposed at least partially within the pixel area and between at least two pixels, and at least one row-select line contact pad connected to each of the row-select lines, each row-select line contact pad disposed at least partially within the pixel area and between at least two pixels.

The matrix-addressed tile can comprise two column-data line contact pads electrically connected to each of the column-data lines, each column-data line contact pad disposed at least partially within the pixel area and between at least two pixels, two row-select line contact pads electrically connected to each of the row-select lines, each row-select line contact pad disposed at least partially within the pixel area and between at least two pixels, or both.

The matrix-addressed tile can comprise a column tile including a plurality of serially connected column-data circuits disposed on the tile substrate at least partially in the pixel area and between at least two pixels, each column-data circuit electrically connected to a column-data line and a column-data line contact pad, a row tile including a plurality of serially connected row-select circuits disposed on the tile substrate at least partially in the pixel area and between at least two pixels, each row-select circuit electrically connected to a row-select line and a row-select line contact pad, or both.

In some embodiments, the column-data circuit is a double-buffered circuit having at least two column storage elements corresponding to each column in the array of pixels.

In some embodiments of the present invention, the column-data circuits of the column tile provide: i) a serial shift register having a serial input and a serially connected column storage element corresponding to each column of pixels in the array of pixels, and ii) a plurality of column-driver circuits, each column-driver circuit responsive to a column storage element and electrically connected to a column-data line that provides column-data signals in common to all of the pixels in the column of pixels or receives column-data signals in common from all of the pixels in the column of pixels, or the row-select circuits of the row tile provide: i) a serial shift register having a serial input and a serially connected row storage element corresponding to each row in the array of pixels, and ii) a plurality of row-driver circuits, each row-driver circuit responsive to a row storage element and electrically connected to a row-select line that provides row-control signals in common to all of the pixels in the row, or the corner tile provides the column-data circuit and the row-select circuit.

In some embodiments, the serial shift register of the column-data circuits includes a serial output electrically connected to a column-data circuit contact pad. In some embodiments, the serial shift register of the row-select circuits includes a serial output electrically connected to a row-select circuit contact pad.

In some embodiments, each column-data circuit comprises a serially connected integrated circuit chiplet disposed on the tile substrate or wherein each column-data circuit comprises a serially connected native circuit formed on or in the tile substrate, each integrated circuit chiplet or native circuit electrically connected to a column-data line, each row-select circuit comprises a serially connected integrated circuit chiplet disposed on the tile substrate or wherein each row-select circuit comprises a serially connected native circuit formed on or in the tile substrate, each integrated circuit chiplet or native circuit electrically connected to a row-select line, or both.

In some embodiments, each integrated circuit chiplet or native portion is electrically connected to one or two column-data lines or is electrically connected to one or two row-select lines.

In some embodiments, the column-data circuit is a first column-data circuit and comprising a redundant column-data circuit electrically connected in parallel with the first column-data circuit, the row-select circuit is a first row-select circuit and comprising a redundant row-select circuit electrically connected in parallel with the first row-select circuit, or both.

In some embodiments, each column-data circuit is located in a first column-data circuit location having first electrical connections and comprising a redundant column-data circuit location, each redundant column-data circuit location having redundant electrical connections electrically connected in parallel with the first electrical connections, each row-select circuit is located in a first row-select circuit location having first electrical connections and comprising a redundant row-select circuit location, each redundant row-select circuit location having redundant electrical connections electrically connected in parallel with the first electrical connections, or both.

In some embodiments, the pixels each include one or more pixel elements comprising a light-emitter, an inorganic light-emitting diode, a photo-diode, or a photo-transistor.

In some embodiments, the tile substrate has a surface on which the pixels or pixel elements are disposed, the pixel elements emit, reflect, or absorb light through the tile substrate and wherein the column-data lines, the column-data line contact pads, the row-select lines, and the row-select line contact pads are disposed on the surface of the tile substrate.

The pixels can each include a control circuit that is electrically connected to the corresponding row-select line and column-data line and is responsive to or controls the one or more pixel elements. The control circuit can have a control circuit substrate that is distinct, separate, and independent of the tile substrate and of the pixel elements. The pixel elements can each have a pixel element substrate that is distinct, separate, and independent of the tile substrate.

In some embodiments, the matrix-addressed tile includes a pixel substrate and the pixel elements of each pixel are disposed on the pixel substrate. The pixel substrate is distinct, separate, and independent of the tile substrate and distinct, separate, and independent of the pixel elements, and the pixel substrate is disposed on the tile substrate.

Each pixel substrate can include an electrical jumper that electrically connects two adjacent portions of a column-data line, the two adjacent portions on opposite sides of a row-select line or wherein each pixel substrate includes an electrical jumper that electrically connects two adjacent portions of a row-select line, the two adjacent portions on opposite sides of a column-data line.

Each pixel can be located in a first pixel location having first electrical connections and comprising a two-dimensional array of redundant pixel locations, each redundant pixel location having redundant electrical connections electrically connected in parallel with the first electrical connections.

In some embodiments, the pixels are first pixels and the matrix-addressed tile further comprises a two-dimensional array of redundant pixels, each electrically connected in parallel with a first pixel.

In various embodiments, the pixel elements receive or emit light through the tile substrate and the row-select line contact pad and the column-data line contact pad are exposed on and electrically accessible from the side of the tile substrate on which the pixels are disposed or wherein the pixel elements receive or emit light in a direction opposite the tile substrate and the row-select line contact pad and the column-data line contact pad are exposed on and electrically accessible through a via in the tile substrate from a side of the tile substrate opposite the side on which the pixels are disposed.

In some embodiments of the present invention, a matrix-addressed tiled system comprises two or more tiles. For each of the two or more tiles a column-data line contact pad on one of the tiles is electrically connected to a column-data line contact pad of another different tile, a row-select line contact pad on one of the tiles is electrically connected to a row-select line contact pad of another different tile, or both.

In some embodiments, the matrix-addressed tiled system comprises a column tile, wherein a column-data line contact pad electrically connected to each of the column-data lines of the column tile is electrically connected to a column data line contact pad of a different column tile, comprises a row tile, wherein a row-select line contact pad electrically connected to each of the row-select lines of the row tile is electrically connected to a row select line contact pad of a different row tile, or comprises a corner tile, wherein a column-data line contact pad electrically connected to each of the column-data lines of the corner tile is electrically connected to a column data line contact pad of a column tile and wherein a row-select line contact pad electrically connected to each of the row-select lines of the corner tile is electrically connected to a row select line contact pad of a row tile.

In some embodiments, the matrix-addressed tiled system comprises a system controller electrically connected to a corner tile. In another configuration, the matrix-addressed tiled system has a plurality of tiles arranged in an array and the corner tile is at the corner of the array of tiles, at an edge of the array of tiles, or within the array of tiles and not on an edge of the array of tiles. A plurality of corner tiles can be included.

In some embodiments, some of the electrical connections between the respective tiles are wire-bond electrical connections or are butted electrical connections.

The matrix-addressed tiled system can be a display system or a sensor system.

The matrix-addressed tiled system can comprise a plurality of the corner tiles arranged in a one- or two-dimensional array, wherein the corner tiles are not electrically connected to each other, and can comprise a system controller electrically connected to each of the corner tiles.

The present invention provides, inter alia, highly integrated passive- or active-matrix micro-LED tiled displays and sensors using, for example, micro-LEDs and micro-controllers forming micro-pixels. In some embodiments, the micro-LEDs and micro-controllers are micro-transfer printed onto a tile substrate to provide a display with a small light-emitting fill factor (aperture ratio) that enables contact pads and row and column control circuits to be integrated on the tile substrate between the micro-pixels so that the tile substrates have no bezel or structures between micro-pixels adjacent to the edge of the tile substrate and the edge of the tile substrate. In some embodiments, the micro-pixels are integrated on a pixel substrate and micro-transfer printed onto the tile substrate as a unit.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 10 is a schematic of a row-select circuit, according to illustrative embodiments of the present invention;

FIGS. 11A-11C illustrate LEDs and connection structures, according to illustrative embodiments of the present invention;

FIG. 12C is a schematic perspective of redundant column-data circuits, according to illustrative embodiments of the present invention;

FIG. 12D is a schematic perspective of redundant row-select circuits, according to illustrative embodiments of the present invention.

The features and advantages of the present disclosure will become more apparent from the detailed description set forth below when taken in conjunction with the drawings, in which like reference characters identify corresponding ele-

DETAILED DESCRIPTION

Figure 1:
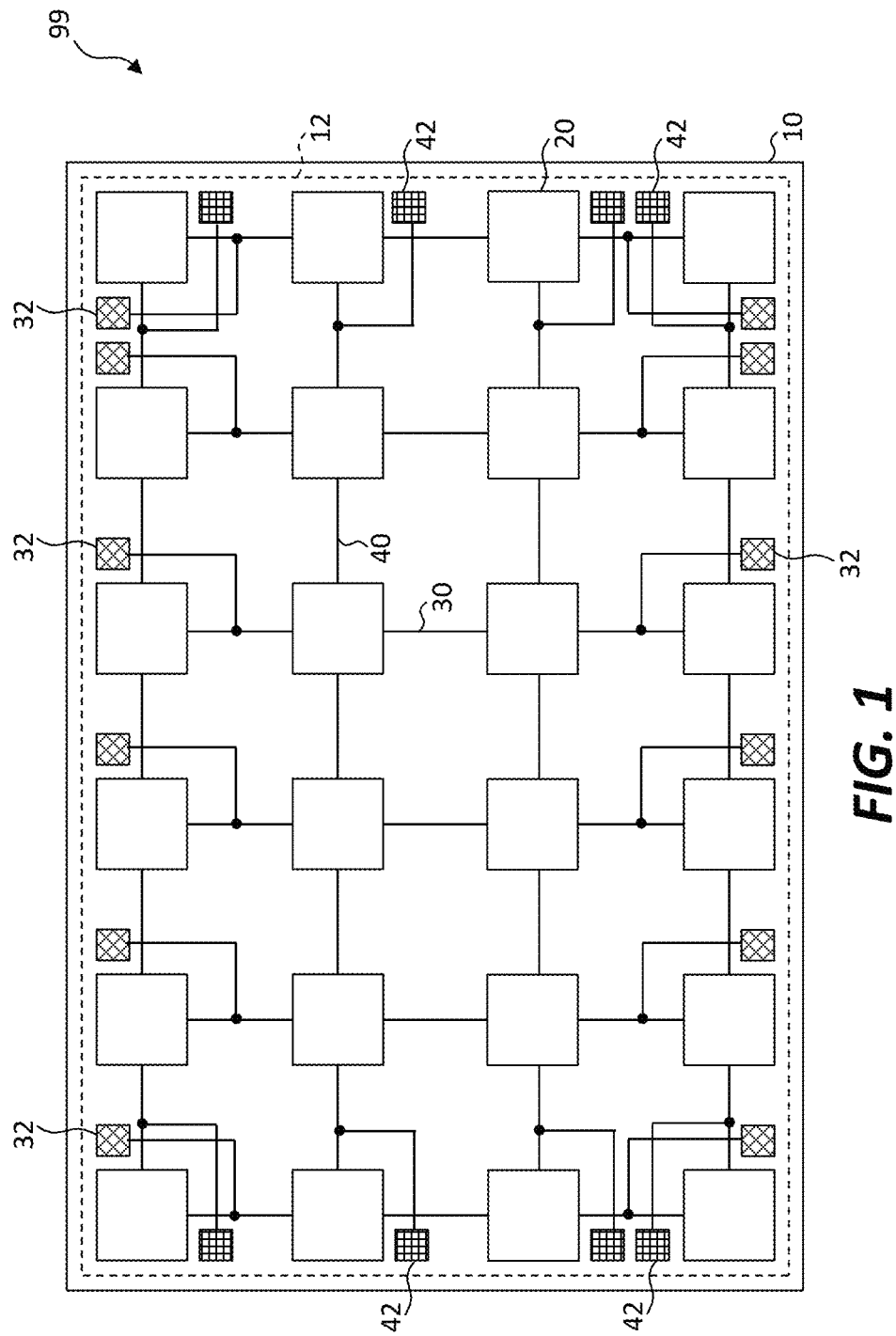
FIG. 1 is a schematic of a matrix-addressed tile, according to illustrative embodiments of the present invention.

Referring to the schematic diagram of FIG. 1, a matrix-addressed tile 99 comprises a tile substrate 10. A two-dimensional array of pixels 20 arranged in rows and columns is disposed on the tile substrate 10. The array of pixels 20 define a contiguous pixel area 12 of the tile substrate 10 that includes all of the pixels 20 in the array of pixels 20. A one-dimensional array of column-data lines 30 is disposed on the tile substrate 10 at least partially in the pixel area 12. Each column-data line 30 is electrically connected to the pixels 20 in a column of pixels 20. A one-dimensional array of row-select lines 40 is disposed on the tile substrate 10 at least partially in the pixel area 12. Each row-select line 40 is electrically connected to the pixels 20 in a row of pixels 20.

At least one column-data line contact pad 32 is electrically connected to each of the column-data lines 30. Each column-data line contact pad 32 is disposed at least partially within the pixel area 12 and between at least two pixels 20. At least one row-select line contact pad 42 is connected to each of the row-select lines 40. Each row-select line contact pad 42 is disposed at least partially within the pixel area 12 and between at least two pixels 20.

Figure 6:
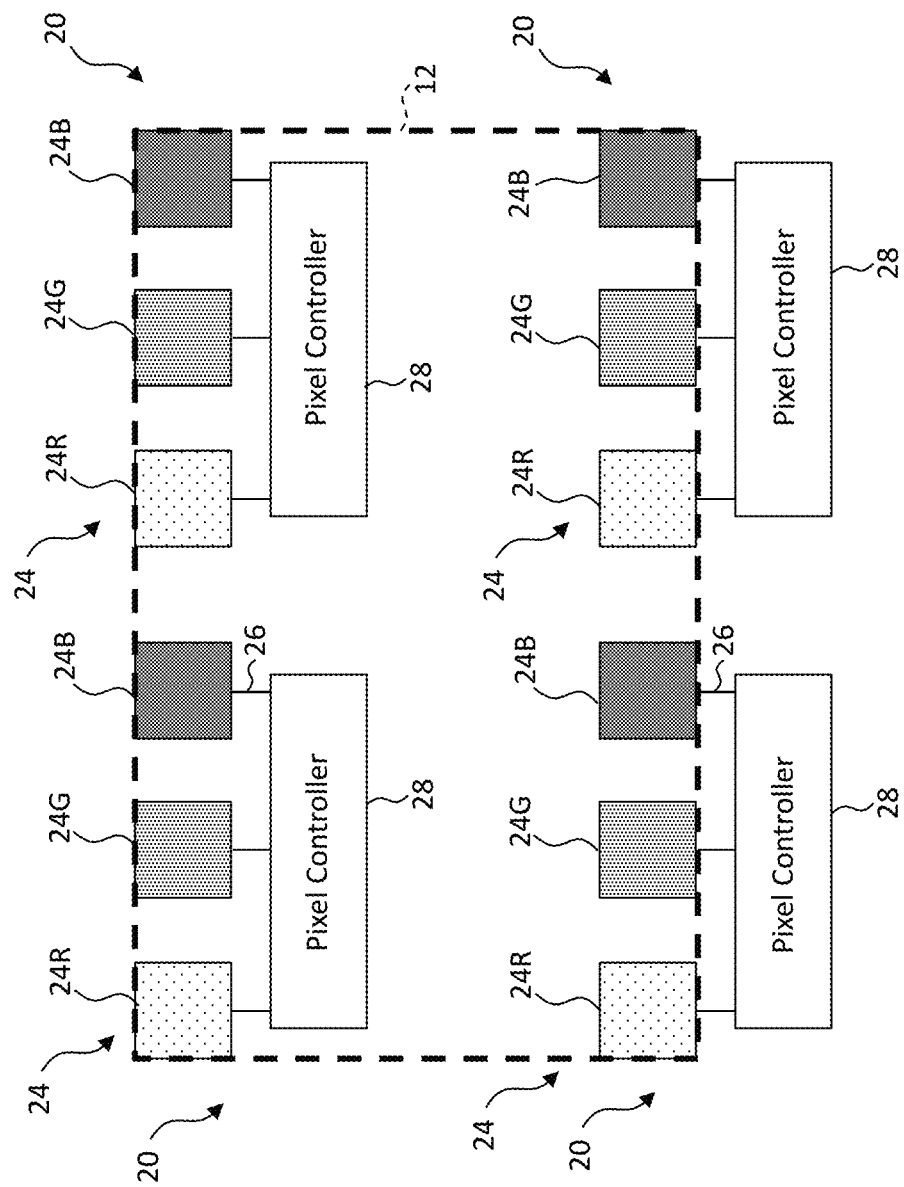
FIG. 6 is a schematic illustration of a pixel area, according to illustrative embodiments of the present invention.

The pixel area 12 is an area of the surface of the tile substrate 10 on or in which the pixels 20 are disposed. In FIG. 1, the pixel area 12 is shown separated from the pixels 20 for clarity. However, in some embodiments of the present invention, a pixel area 12 of a tile substrate 10 is the area enclosed by a polygon with the smallest perimeter that encloses all of the pixels 20 or the pixel area 12 of the tile substrate 10 is the area enclosed by a convex hull that encloses all of the pixels 20. In some embodiments and referring to FIG. 6, the pixels 20 include pixel elements 24, for example red, green, and blue pixel elements 24R, 24G, 24B that, for example, emit red, green, and blue light, respectively, and the pixel area 12 is the area enclosed by a polygon with the smallest perimeter that encloses all of the pixel elements 24 or the pixel area 12 is the area enclosed by a convex hull that encloses all of the pixel elements 24, as shown. Pixel elements 24 in a pixel 20 can be controlled by a corresponding pixel controller 28, for example in an active-matrix configuration. A pixel controller 28 can be, but is not necessarily within a pixel area 14 of a tile substrate 10. Pixel elements 24 can be micro-light-emitting diodes (micro-LEDs). In some embodiments, the row-select and column-data line contact pads 42, 32, or the row-select or column data lines 40, 30 are completely within the pixel area 12.

Lines in certain embodiments of the present invention (e.g., the column-data lines 30 or the row-select lines 40 and other lines discussed further below) are electrical conductors such as wires or traces patterned on or in the tile substrate 10, for example made of metal or metal alloys or conductive polymers, that carry electrical power, ground, or data signals. A line (or other element of the invention) that is between two pixels 20 is between in a direction substantially parallel to a surface of the tile substrate 10 on which the pixels 20 are disposed or formed.

Contact pads according to certain embodiments of the present invention (e.g., the row-select line contact pads 42 or the column-data line contact pads 32) can be electrically conductive portions over, on, or in a tile substrate 10, for example rectangular portions, that have a patterned electrical contact for making an electrical connection to an electrical conductor that extends externally to the tile substrate 10. The portions can be dedicated conductive areas or simply designated portions of an electrical conductor, wire, or line.

In some embodiments of the present invention, a matrix-addressed tile 99 comprises two column-data line contact pads 32 electrically connected to each of the column-data lines 30, each column-data line contact pad 32 disposed at least partially within the pixel area 12 and between at least two pixels 20. Column-data line contact pads 32 can be disposed or electrically connected at opposite ends of column-data lines 30 in a pixel area 12 or adjacent to opposite edges or sides of the pixel area 12 of a tile substrate 10. A column-data line contact pad 32 adjacent to an edge or side of the pixel area 12 is the column-data line contact pad 32 that is closest to the edge or side of the pixel area 12 of the tile substrate 10.

In some embodiments of the present invention, a matrix-addressed tile 99 comprises two row-select line contact pads 42 electrically connected to each of the row-select lines 40, each row-select line contact pad 42 disposed at least partially within the pixel area 12 and between at least two pixels 20. Row-select line contact pads 42 can be disposed or electrically connected at opposite ends of row-select lines 40 in a pixel area 12 or adjacent to opposite edges or sides of the pixel area 12 of the tile substrate 10. A row-select line contact pad 42 adjacent to an edge or side of the pixel area 12 is the row-select line contact pad 42 that is closest to the edge or side of the pixel area 12 of the tile substrate 10.

In some embodiments, a matrix-addressed tile 99 includes two column-data line contact pads 32 electrically connected to each of the column-data lines 30 and two row-select line contact pads 42 electrically connected to each of the row-select lines 40, as described above and as shown in FIG. 1.

Figure 2A:
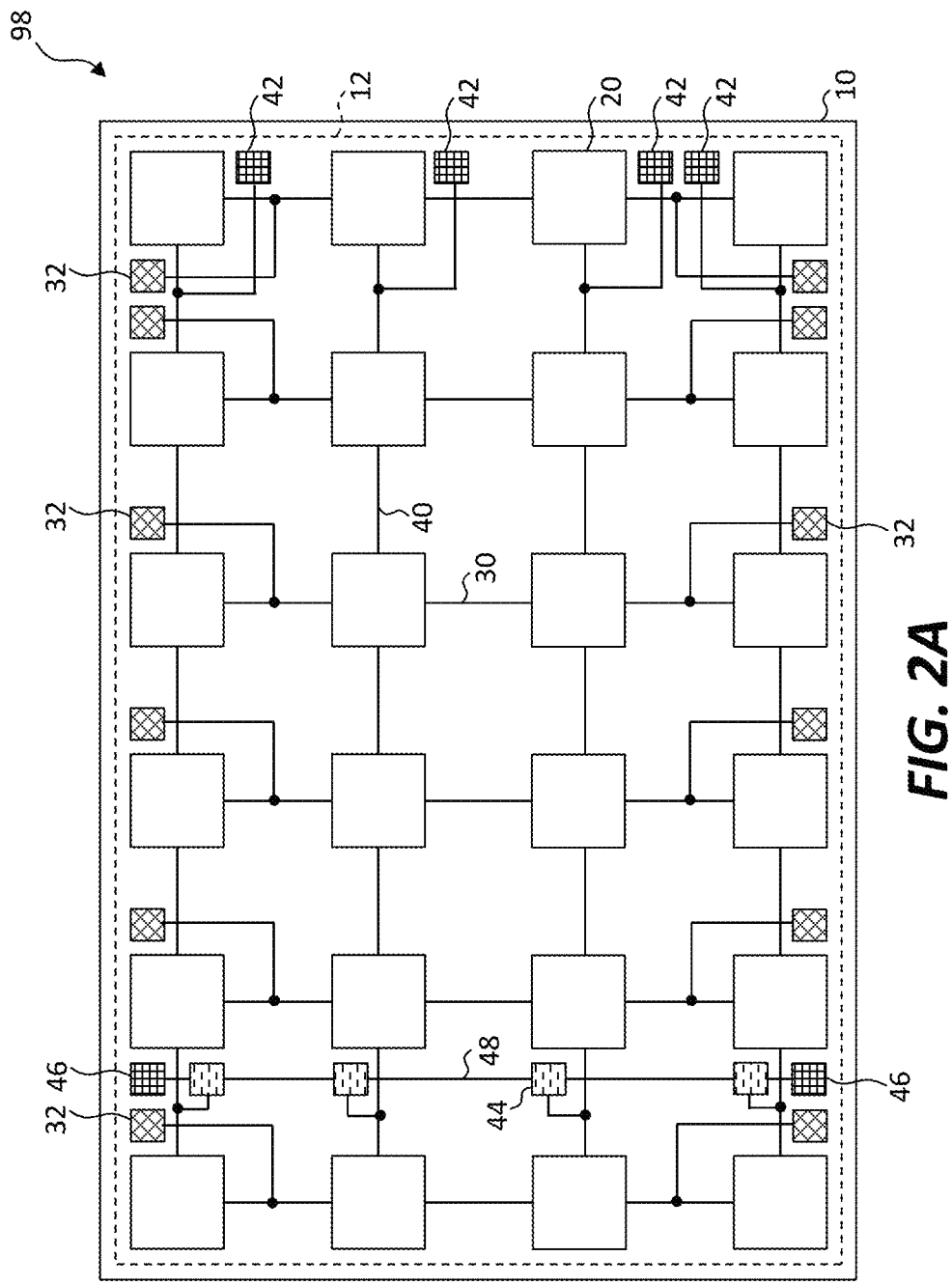
FIGS. 2A and 2B are schematics of row tiles including row-select circuits, according to illustrative embodiments of the present invention.
Figure 2B:
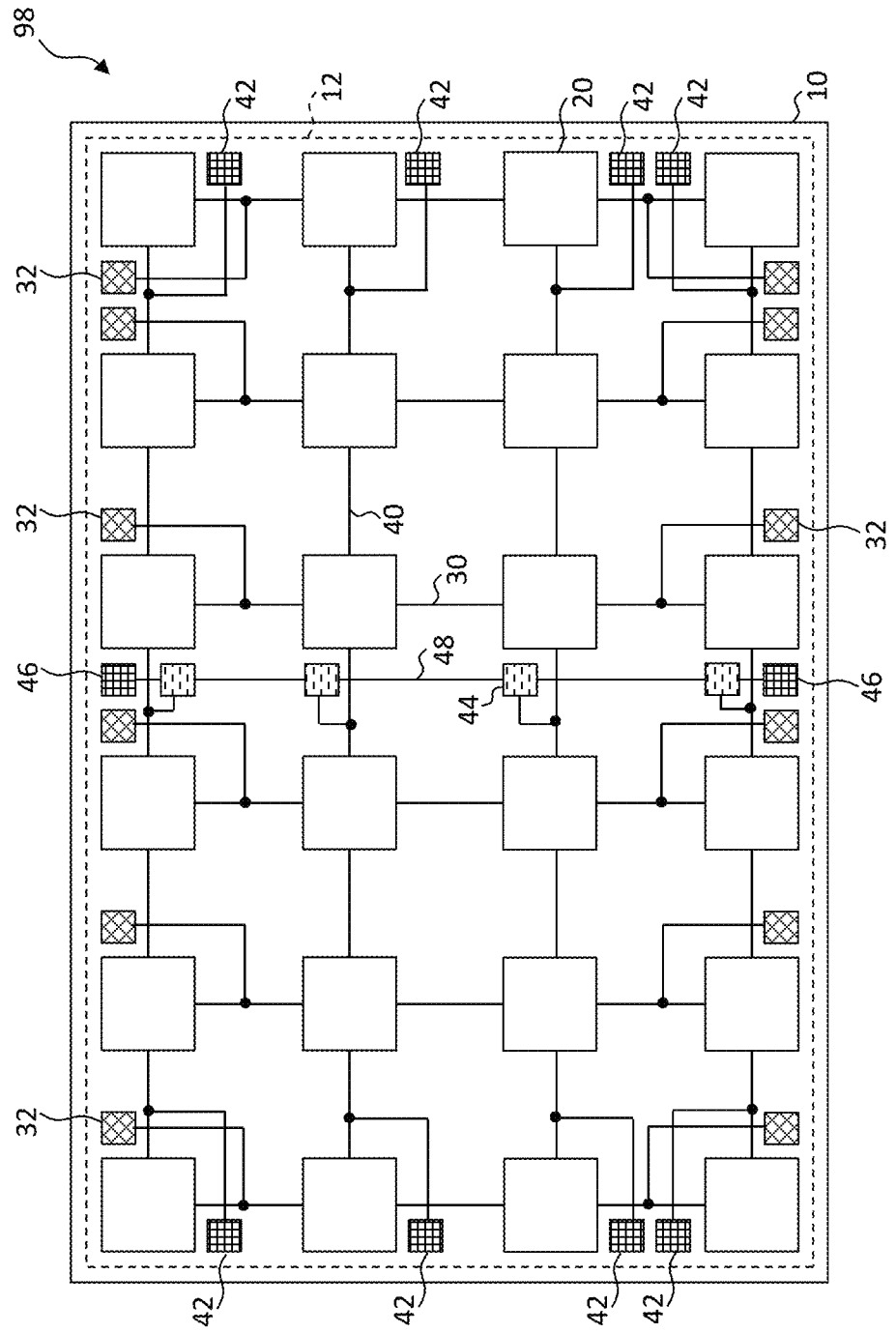

Referring to FIGS. 2A and 2B and in some embodiments of the present invention, a matrix-addressed tile 99 includes a plurality of serially connected row-select circuits 44 disposed in a column. Each row-select circuit 44 is disposed on the tile substrate 10 at least partially in the pixel area 12 and between at least two pixels 20. Each row-select circuit 44 is electrically connected to a row-select line 40 and a row-select line contact pad 42. The row-select circuits 44 are serially connected with one or more serial row lines 48 and the row-select circuits 44 at each end of the series are electrically connected to one or more row-select circuit contact pads 46. A matrix-addressed tile 99 that includes the row-select circuits 44 and row-select circuit contact pads 46 is a row tile 98. As with row-select line contact pads 42, row-select circuit contact pads 46 can be disposed or electrically connected adjacent to opposite edges or sides of a pixel area 12 of a tile substrate 10 and are disposed on the tile substrate 10 at least partially in the pixel area 12 and between at least two pixels 20. In some embodiments, row-select circuits 44 or row-select circuit contact pads 46 are completely within a pixel area 12.

Each row-select circuit 44 is electrically connected to a different row-select line 40 and is serially connected to an adjacent row-select circuit 44 by the serial row line 48. The serial row line 48 is electrically connected at either end of the series of row-select circuits 44 to the row-select circuit contact pads 46. The serial row line 48 comprises electrically separate and independent segments, each connected to a different pair of row-select circuits 44 or a row-select circuit 44 and a row-select circuit contact pad 46. Thus, a signal (for example a select signal) that is provided on one of the row-select circuit contact pads 46 can be input by a row-select circuit 44 to which the row-select circuit contact pad 46 is electrically connected by a serial row line 48. The select signal can then be transmitted to the next row-select circuit 44 through the serial row line 48, and then to the next row-select circuit 44, and so on, until the signal is available on the other row-select circuit contact pad 46. Thus, the signal is serially transferred from the one row-select circuit contact pad 46, through each of the row-select circuits 44 in turn until it is available and output on the other row-select circuit contact pad 46.

As shown in FIG. 2A, the row tile 98 has row-select line contact pads 42 at only one edge of the pixel area 12 and the row-select circuits 44 are provided at the opposite edge of the pixel area 12. Since the row-select circuit 44, corresponding row-select line 40, and corresponding row-select line contact pad 42 are all electrically connected in common, the row-select circuit 44 can be disposed and electrically connected anywhere between the opposing edges of the pixel area 12 and a row-select line contact pad 42 provided at both edges (as in FIG. 1). Referring to FIG. 2B, the row-select circuits 44 and row-select circuit contact pads 46 are provided more centrally in the pixel area 12.

Figure 3A:
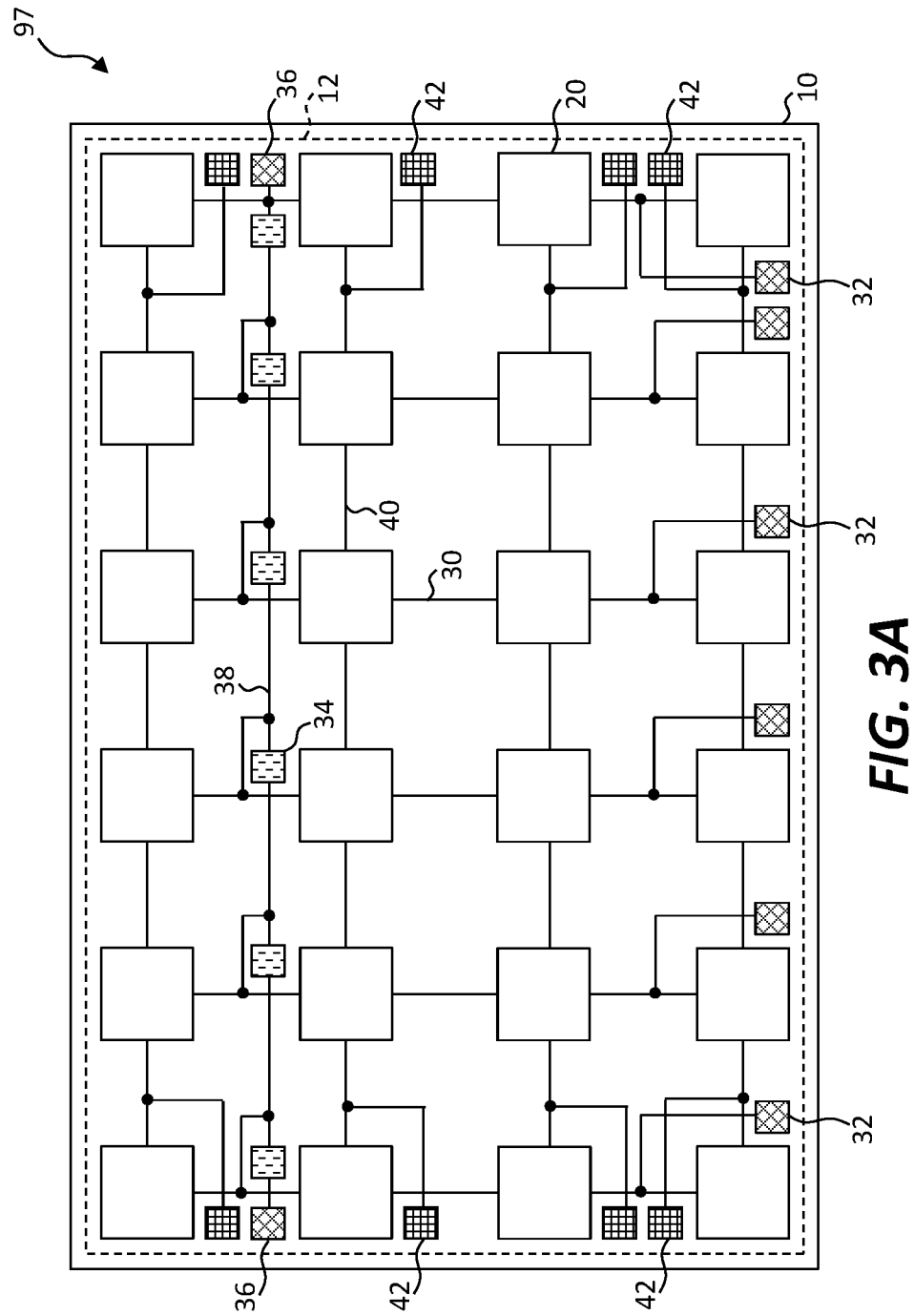
FIGS. 3A and 3B are schematics of column tiles including column-data circuits, according to illustrative embodiments of the present invention.
Figure 3B:
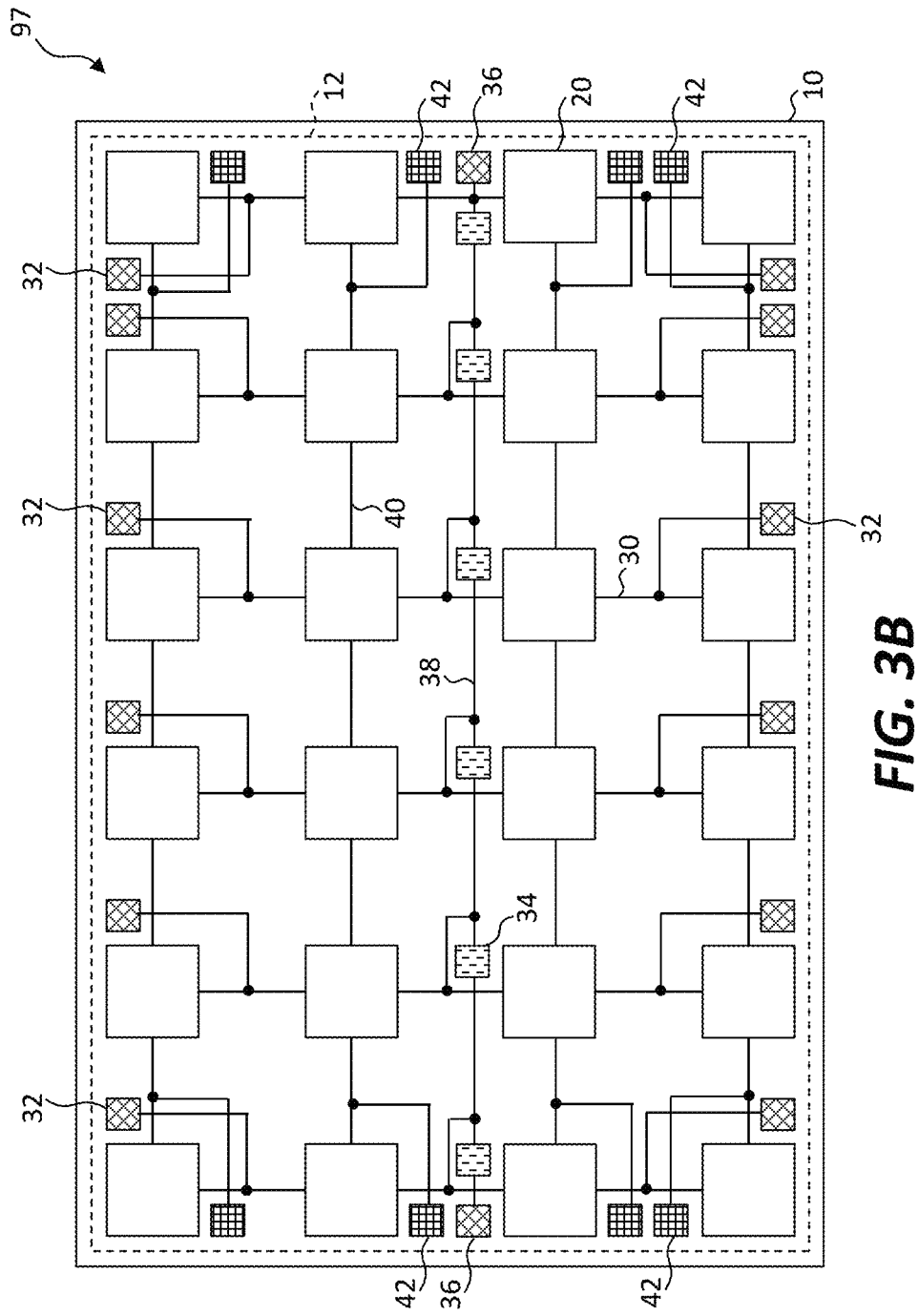

Referring to FIGS. 3A and 3B in some embodiments of the present invention, a matrix-addressed tile 99 includes a plurality of serially connected column-data circuits 34 disposed in a row. Each column-data circuit 34 is disposed on the tile substrate 10 at least partially in the pixel area 12 and between at least two pixels 20. Each column-data circuit 34 is electrically connected to a column-data line 30 and a column-data line contact pad 32. The column-data circuits 34 are serially connected with one or more serial column lines 38 and the column-data circuits 34 at each end of the series are electrically connected to one or more column-data circuit contact pads 36. A matrix-addressed tile 99 that includes the column-data circuits 34 and column-data circuit contact pads 36 is a column tile 97. As with column-data line contact pads 32, column-data circuit contact pads 36 can be disposed or electrically connected adjacent to opposite edges or sides of a pixel area 12 of a tile substrate 10 and are disposed on the tile substrate 10 at least partially in the pixel area 12 and between at least two pixels 20. In some embodiments, column-data circuits 34 or column-data circuit contact pads 36 are completely within a pixel area 12.

Each column-data circuit 34 is electrically connected to a different column-data line 30 and is serially connected to an adjacent column-data circuit 34 by the serial column line 38. The serial column line 38 is electrically connected at either end of the series of column-data circuits 34 to the column-data circuit contact pads 36. The serial column line 38 comprises electrically separate and independent segments, each connected to a different pair of column-data circuits 34 or a column-data circuit 34 and a column-data circuit contact pad 36. Thus, a signal (for example a data signal) that is provided on one of the column-data circuit contact pads 36 can be input by a column-data circuit 34 to which the column-data circuit contact pad 36 is connected by a serial column line 38. The data signal can then be transmitted to the next column-data circuit 34 through the serial column line 38, and then to the next column-data circuit 34, and so on, until the data signal is available on the other column-data circuit contact pad 36. Thus, the data signal is serially transferred from the one column-data circuit contact pad 36, through each of the column-data circuits 34 in turn until it is available and output on the other column-data circuit contact pad 36.

As shown in FIG. 3A, the column tile 97 has column-data line contact pads 32 at only one edge of the pixel area 12 and the column-data circuits 34 are provided at the opposite edge of the pixel area 12. Since the column-data circuit 34, corresponding column-data line 30, and corresponding column-data line contact pad 32 are all electrically connected in common, the column-data circuit 34 can be disposed and electrically connected anywhere between the opposing edges of the pixel area 12 and a column-data line contact pad 32 provided at both edges (as in FIG. 1). Referring to FIG. 3B, the column-data circuits 34 and column-data circuit contact pads 36 are provided more centrally in the pixel area 12.

Figure 4A:
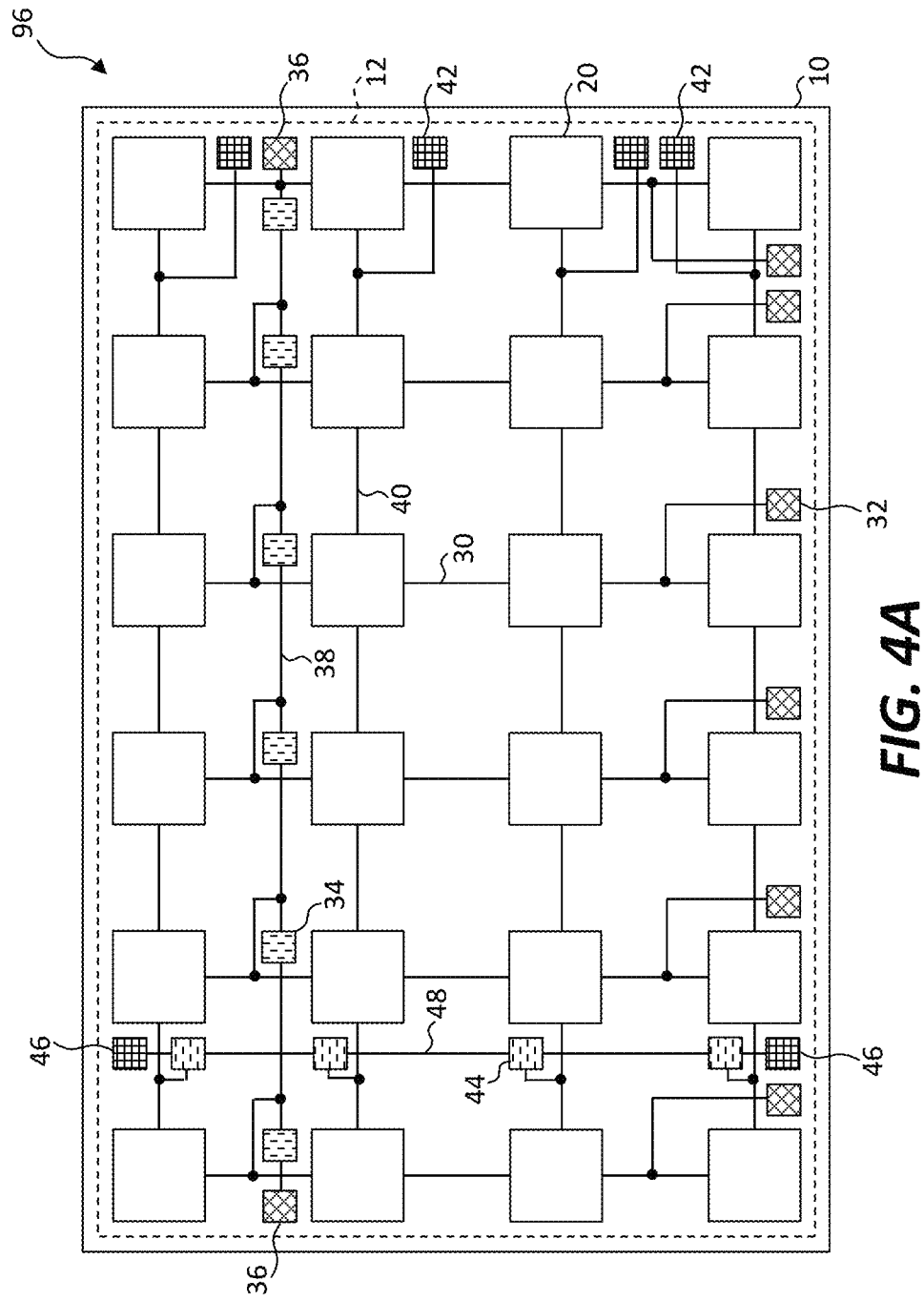
FIGS. 4A and 4B are schematics of corner tiles including row-select circuits and column-data circuits, according to illustrative embodiments of the present invention.
Figure 4B:
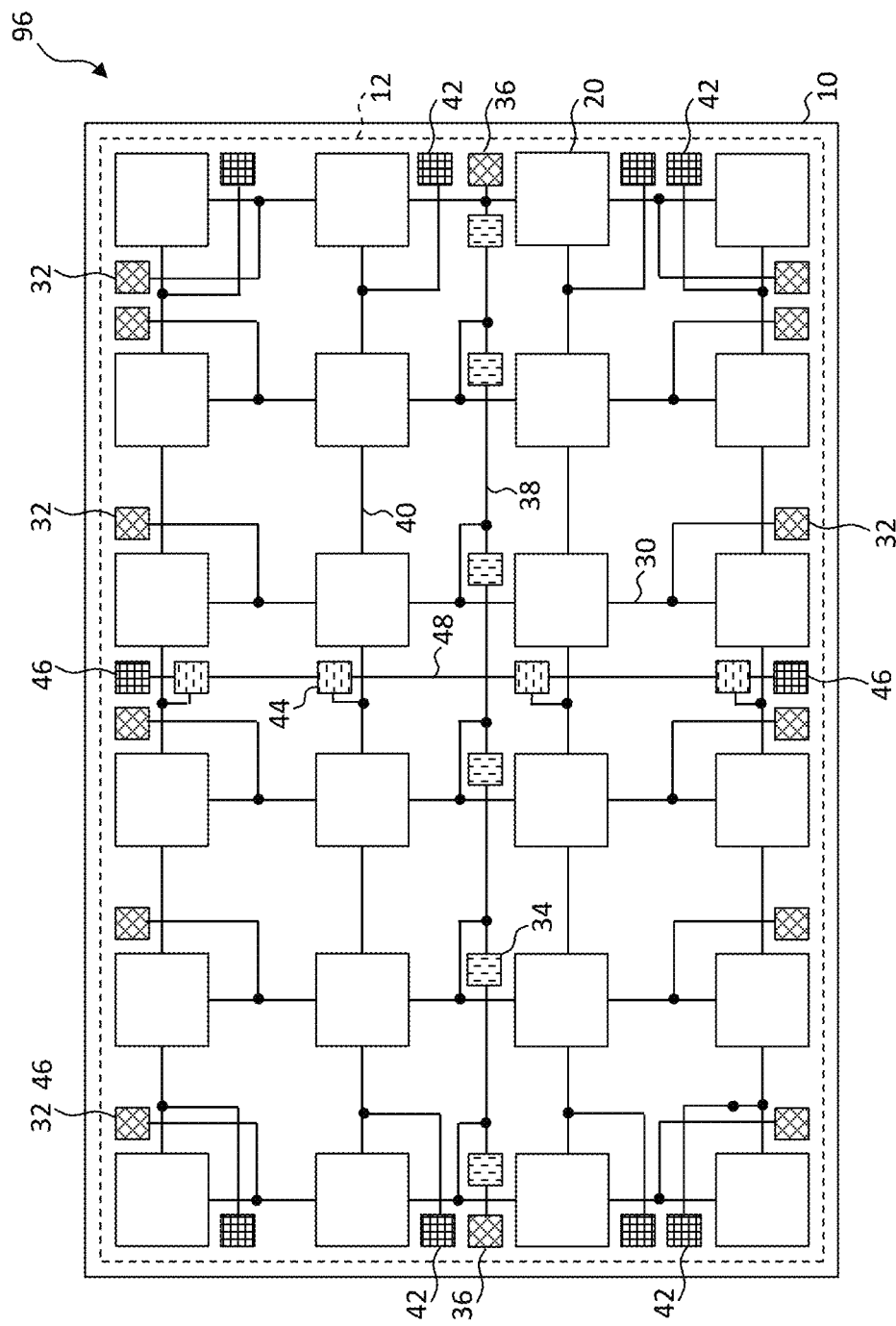

Referring to FIG. 4A, the embodiments of FIGS. 2A and 3A are combined in a matrix-addressed tile 99 that includes a plurality of serially connected column-data circuits 34 and a plurality of serially connected row-select circuits 44 to form a corner tile 96. As with the embodiments of FIGS. 2B and 3B, referring to FIG. 4B, the plurality of serially connected column-data circuits 34 and a plurality of serially connected row-select circuits 44 can be disposed more centrally in the pixel area 12 to form a corner tile 96.

Figure 5A:
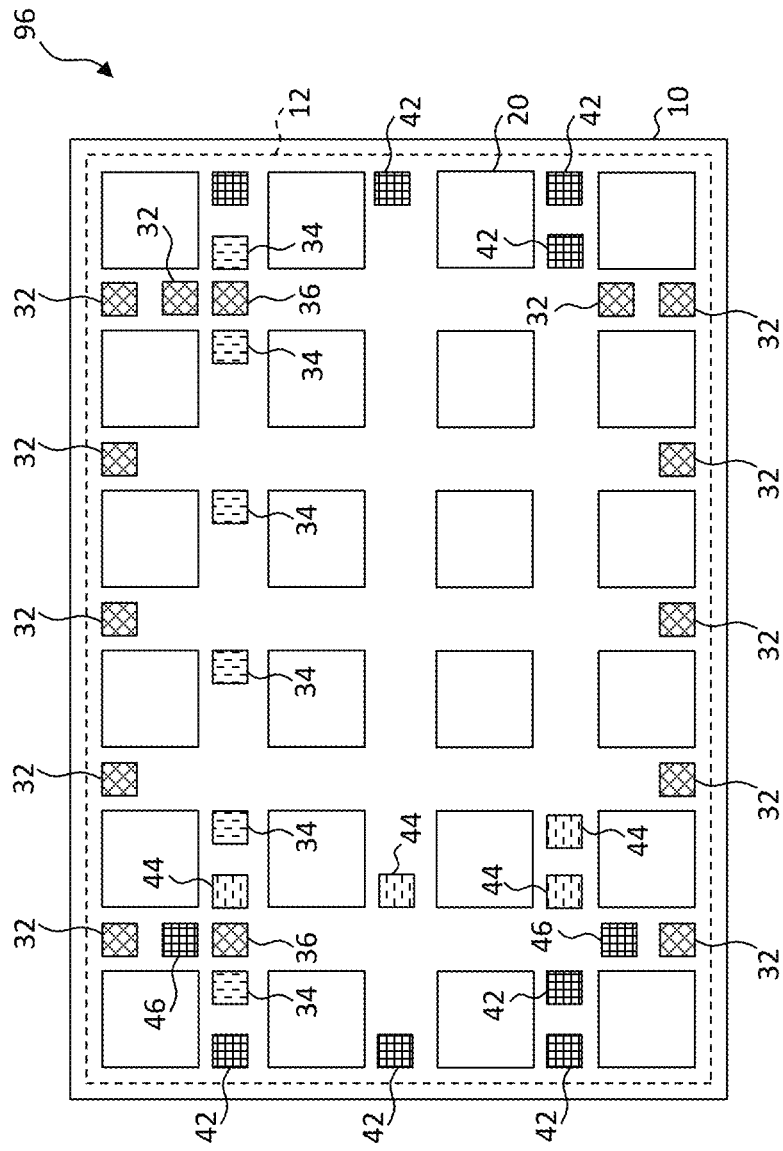
FIGS. 5A and 5B are schematics of corner tiles including row-select circuits and column-data circuits in a high-density configuration, according to illustrative embodiments of the present invention.
Figure 5B:
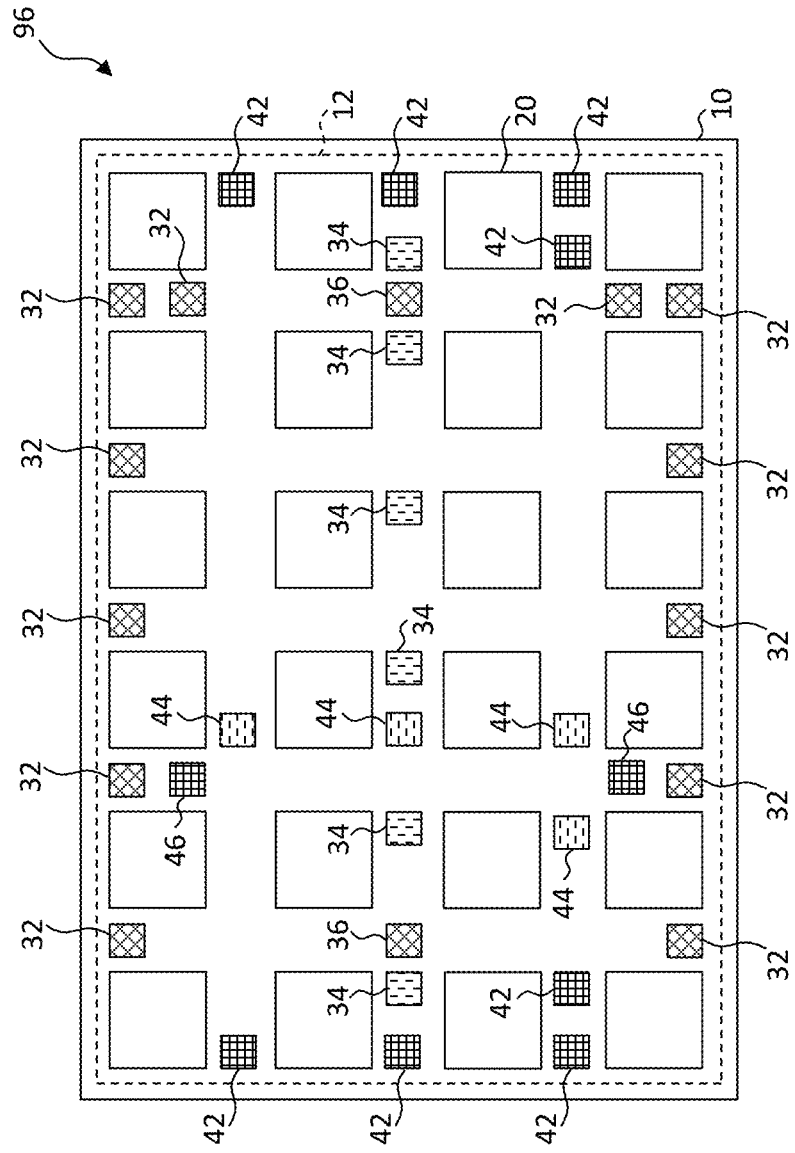

The embodiments in FIGS. 2A-4B illustrate two contact pads between some of the pixels 20 at the edge of the pixel area 12. In some embodiments of the present invention, as illustrated in FIGS. 5A and 5B, structures in the matrix-addressed corner tiles 96 can be arranged in a denser configuration in arrangements corresponding to FIGS. 4A and 4B, respectively. Of course, any layout of the structures in a matrix-addressed tile 99 will be subject to the relative sizes and aspect ratios of the matrix-addressed tile substrate 10 and the sizes, aspect ratios, and resolutions of the various contact pads, lines, and circuits in the matrix-addressed tile 99.

Figure 7:
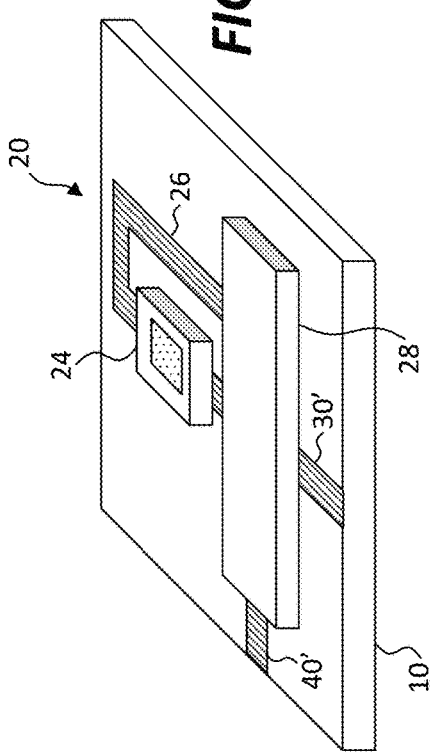
FIGS. 7 and 8 are schematic perspectives of pixels, according to illustrative embodiments of the present invention.
Figure 8:
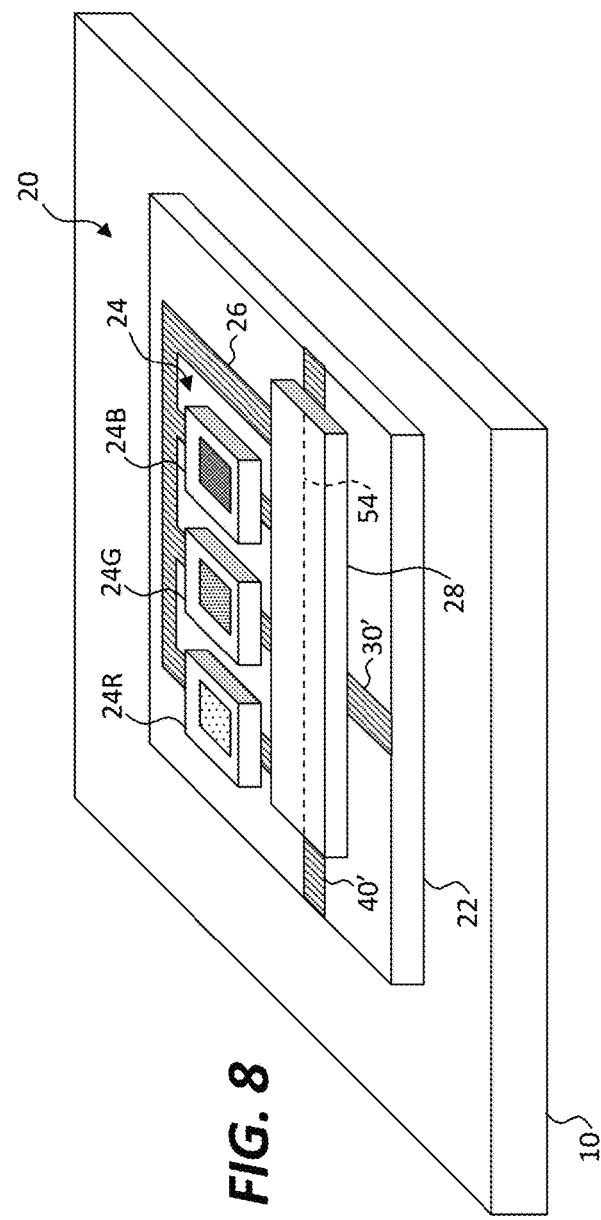

In some embodiments of the present invention, a matrix-addressed tile 99 is a passive-matrix-addressed tile 99 or an active-matrix-addressed tile 99. In both passive- and active-matrix embodiments, pixels 20 can each include one or more pixel elements 24, for example comprising a light-emitter, an inorganic light-emitting diode (iLED), a micro-iLED, a photo-diode, or a photo-transistor. Referring to FIGS. 7 and 8, in some embodiments, in an active-matrix-addressed tile 99, pixels 20 also include a pixel controller 28 with a control circuit that is electrically connected to a corresponding row-select line 40 and column-data line 30 of the pixel 20 and is responsive to or controls the one or more pixel elements 24, for example to controllably sense, emit, or reflect light.

Pixel elements 24 or a pixel controller 28 (or both) can be formed on or in a tile substrate 10 (e.g., so that the pixel elements 24 or pixel controller 28 are native to the tile substrate 10) or, as shown in FIG. 7, pixel elements 24 or a pixel controller 28 (or both) are each formed in or on a substrate that is distinct, separate, and independent of the tile substrate 10 or substrates of other pixel elements 24 or pixel controllers 28. Pixel elements 24 or a pixel controller 28, each having their own substrate, can then be disposed on the tile substrate 10, for example using micro-transfer printing. In some embodiments, pixel elements 24 or a pixel controller 28 are formed on or in a pixel substrate 22 that is distinct, separate, and independent of a tile substrate 10 (so that the pixel elements 24 or pixel controller 28 are native to the pixel substrate 22) and one or more of the pixel substrates 22 are disposed on the tile substrate 10, for example by micro-transfer printing. In the exemplary embodiment shown in FIG. 8, each pixel element 24 or pixel controller 28 is formed in or on a substrate that is distinct, separate, and independent of the tile substrate 10, the substrates of other pixel elements 24 or pixel controllers 28, and the pixel substrate 22 and then disposed on the pixel substrate 22, for example using micro-transfer printing. One or more of the pixel substrates 22 is in turn disposed on the tile substrate 10, for example using micro-transfer printing.

The use of micro-transfer printing enables the assembly of very small unpackaged bare die integrated circuits on substrates. The result can be a device with a very small fill factor or aperture ratio, enabling the construction of contact pads, wires, circuits, and integrated circuits in a small and compact space entirely within a pixel area 12 in a matrix-addressed tile 99, thereby enabling a matrix-addressed tile 99 with little or no bezel or space between the pixels 20 and the edges of the tile substrate 10.

In some embodiments of the present invention, to assist with routing wires (e.g., column-data lines 30 or row-select lines 40) on a tile substrate 10, each pixel substrate 22 includes an electrical jumper 54 that electrically connects two adjacent portions of a column-data line 30 on opposite sides of a row-select line 40. In some embodiments, and as shown in FIG. 8, each pixel substrate 22 includes an electrical jumper 54 that electrically connects two adjacent portions of a row-select line 40 on opposite sides of a column-data line 30. The row-select line 40 and column-data line 30 on the pixel substrate 22 are indicated with an apostrophe as row-select line 40' and column-data line 30', respectively.

Figure 9:
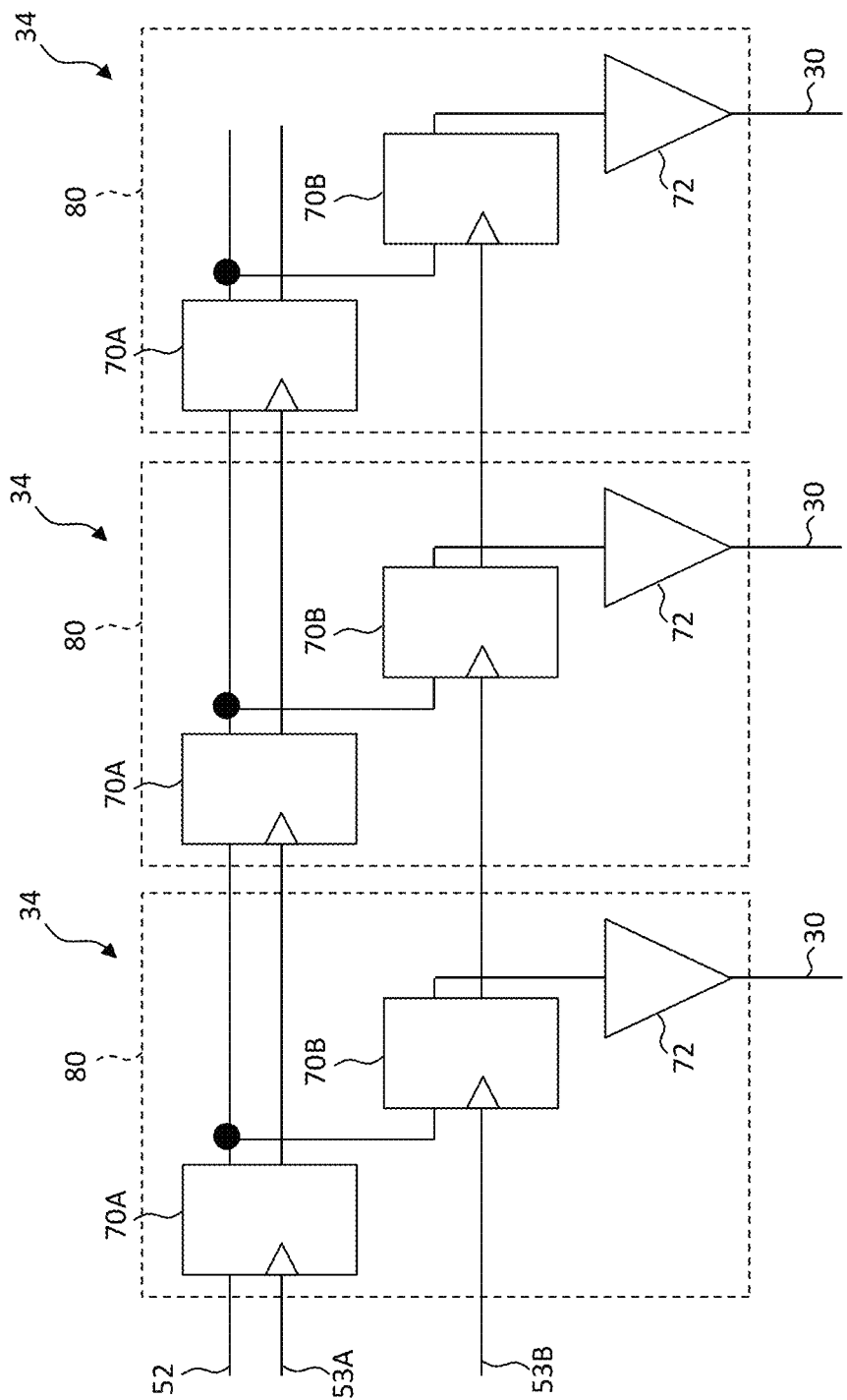
FIG. 9 is a schematic of a column-data circuit, according to illustrative embodiments of the present invention.

FIG. 9 is a schematic of three serially connected column-data circuits 34. Each of the three column-data circuits 34 corresponds to a different column of pixels 20 in the array of pixels 20 and includes a double-buffered circuit having at least two column storage elements 70A, 70B (e.g., D flip-flops or latches) and a driver 72 (e.g., a power or driving transistor) that drives a signal (e.g., a data signal) onto a column-data line 30 corresponding to the column of pixels 20. Column-data circuits 34 can be driven with power, ground, and control signals (e.g., a data signal 52 and clock signal 53) on control lines (e.g., wires, traces, or other electrical conductors on the tile substrate 10) from an external controller, for example a display or sensor controller (not shown), or from another matrix-addressed tile 99. Each column-data circuit 34 can comprise a serially connected integrated circuit chiplet (e.g., integrated circuit 80) disposed on a tile substrate 10 or a native circuit formed on or in the tile substrate 10 and electrically connected to a column-data line 30. Integrated circuits 80 can be, for example, digital, analog, or mixed-signal integrated circuits 80, or any combination of such integrated circuits 80. In some embodiments, each column-data circuit 34 is provided in a single, micro-transfer printable integrated circuit 80. In some embodiments, two column-data circuits 34 are provided in a single integrated circuit 80 or native portion and the integrated circuit 80 or native portion is electrically connected to one or two column-data lines 30, for example adjacent column-data lines 30, reducing the number and total size of the integrated circuits 80. In some embodiments, discrete components are used in combination with integrated circuits or exclusively.

In operation, a data signal 52 is presented to the input of the first column-data circuit 34 and a first clock signal 53A shifts the data through the first flip-flops 70A to load a row of data values into the column-data circuits 34. Once loaded, a second clock signal 53B shifts the data values from the first flip-flops 70A to the second flip-flops 70B. The output of the second flip-flops 70B is then presented through the driver 72 to the respective column-data lines 30 while a second row of data values are shifted into the first flip-flops 70A and the process is repeated.

Thus, the column-data circuits 34 together provide a serial shift register having a serial input and serially connected column storage elements 70, each corresponding to a column in the array of pixels 20 and a plurality of column-driver circuits (e.g., driver 72). Each column-driver circuit 72 is responsive to a column storage element 70 and is electrically connected to a column-data line 30 that provides column-data signals in common to all of the pixels 20 in the corresponding column of pixels 20 or receives column-data signals in common from all of the pixels 20 in the column of pixels 20.

FIG. 10 is a schematic of two serially connected row-select circuits 44. Each row-select circuit 44 corresponds to a different row of pixels 20 in the array of pixels 20 and includes a storage element 70 (e.g., a D flip-flop), a driver 72, a pulse width modulation (PWM) generator 74, and a state-machine controller 76. The row-select circuits 44 together provide a serial shift register having a serial input and serially connected row storage elements 70 (e.g., flip-flops), each corresponding to a row in the array of pixels 20, and a plurality of row-driver circuits (e.g., driver 72). Each row-driver circuit 72 is responsive to a row storage element 70 and is electrically connected to a row-select line 40 that provides row-control signals in common to all of the pixels 20 in the row.

Row-select circuits 44 can be driven with power, ground, and control signals (e.g., a select signal 51 and clock signal 53) on control lines (e.g., wires, traces, or other electrical conductors on the tile substrate 10) from an external controller. Each row-select circuit 44 can comprise a serially connected integrated circuit chiplet (e.g., integrated circuit 80) disposed on the tile substrate 10 or native circuit formed on or in the tile substrate 10 and electrically connected to a row-select line 40. The integrated circuits 80 can be, for example, digital, analog, or mixed-signal integrated circuits 80, or any combination of such integrated circuits 80. In some embodiments, each row-select circuit 44 is provided in a single, micro-transfer printable integrated circuit 80. In some embodiments, two row-select circuits 44 are provided in a single integrated circuit 80 or native portion and the integrated circuit 80 or native portion is electrically connected to one or two row-select lines 40, for example adjacent row-select lines 40, reducing the number and total size of the integrated circuits 80. In some embodiments, discrete components are used in combination with integrated circuits or exclusively.

In operation, a row-select signal 51 is presented to the input of the first row-select circuit 44 and a clock signal 53 shifts the row-select signal into the flip-flop 70. Under the control of the state-machine controller 76 and in coordination with the column-data circuits 34 (not shown), the row-select line 40 operates to shift the data presented on the column-data lines 30 into the pixels 20 (not shown). Once the data is loaded, the PWM generator 74 provides timing signals that are provided on the row-select line 40 to control the output of data in the pixels 20, to enable a digital display or sensor. At the same time, a clock signal 53 transfers the row-select signal to the next row-select circuit 44 which then operates to load data into the next row of pixels 20 and the process is repeated to load and then output data into each successive row of pixels 20.

In some embodiments of the present invention, a corner tile 96 includes the column-data circuits 34 of FIG. 9 and the row-select circuits 44 of FIG. 10.

In some active-matrix embodiments, a row-select circuit 4 and a column-data circuit 34 operate in conjunction with a pixel controller 28. In some embodiments, a pixel controller 28 drives pixel elements 24 with a current-controlled drive signal. The current-controlled drive signal can convert an analog value (e.g., a charge stored in a capacitor analog pixel storage element 70) to a current drive signal or, as shown, the current-controlled drive signal can convert a digital bit value (e.g., a voltage stored in a flip-flop or latch digital pixel storage element 70) to a current drive signal, thus forming a bit-to-current convertor. Current-drive circuits, such as current replicators, are known in the art and can be controlled with a pulse-width modulation scheme whose pulse width is determined by the digital bit value. A separate pixel controller 28 can be provided for each pixel element 24 or a common pixel controller 28, or a pixel controller 28 with some common components, can be used to drive pixel elements 24 in response to the data values stored in pixel storage elements 70. In some embodiments, a power connection, a ground connection, a data input, and a clock signal 53 control a pixel storage element 70.

Referring to FIG. 11A, in some embodiments of the present invention, the tile substrate 10 of the matrix-addressed tile 99 has a surface on which the pixels 20 or pixel elements 24 are disposed. The pixel elements 24 emit, reflect, sense, or absorb light through the tile substrate 10. The column-data lines 30, the column-data line contact pads 32, the row-select lines 40, and the row-select line contact pads 42 are disposed on the surface of the tile substrate 10. Thus, light emitted, reflected, or absorbed by the pixel elements 24 are not interfered with, occluded, reflected, diffracted, or absorbed by the column-data lines 30, column-data line contact pads 32, the row-select lines 40, and the row-select line contact pads 42, or by the row-select circuits 44, row-select circuit contact pad 46, serial row line 48, the column-data circuits 34, column-data circuit contact pad 36, or serial column line 38. If the pixel element 24 is disposed on the pixel substrate 22, the pixel elements 24 also emit, reflect, or absorb light through the pixel substrate 22. In some embodiments, a tile substrate 10 and a pixel substrate 22 are transparent, for example at least 50%, at least 75%, at least 80%, at least 90% or at least 95% transparent to visible light.

According to some embodiments of the present invention, a tile substrate 10 and pixel substrate 22 are substantially transparent to visible light (e.g., at least 70% transparent). Pixel elements 24 can therefore emit or receive light 82 through a tile substrate 10 and pixel substrate 22, as shown in FIG. 11A in a bottom-emitter configuration. In certain embodiments, such an arrangement has the advantage that contact pads (e.g., column-data line contact pad 32 and row-select line contact pad 42 electrically connected to the column-data line 30 and row-select line 40, respectively, with pixel wires 26 in a passive-matrix configuration) can be accessed from the side of a tile substrate 10 opposite the side from which light is emitted, so that any electrical connections to the tile substrate 10 do not interfere with emitted or sensed light 82. In the top-emitter configurations of FIGS. 11B and 11C, light is emitted or sensed in a direction opposite the tile substrate 10 or pixel substrate 22. In some such embodiments, electrical connections to contact pads can be made through through-substrate vias 84 in a tile or pixel substrates 10, 22, as shown. In the exemplary embodiment of FIG. 11B, the through-substrate vias 84 are not filled; in the exemplary embodiment of FIG. 11C, the through-substrate vias 84 are filled.

Figure 12A:
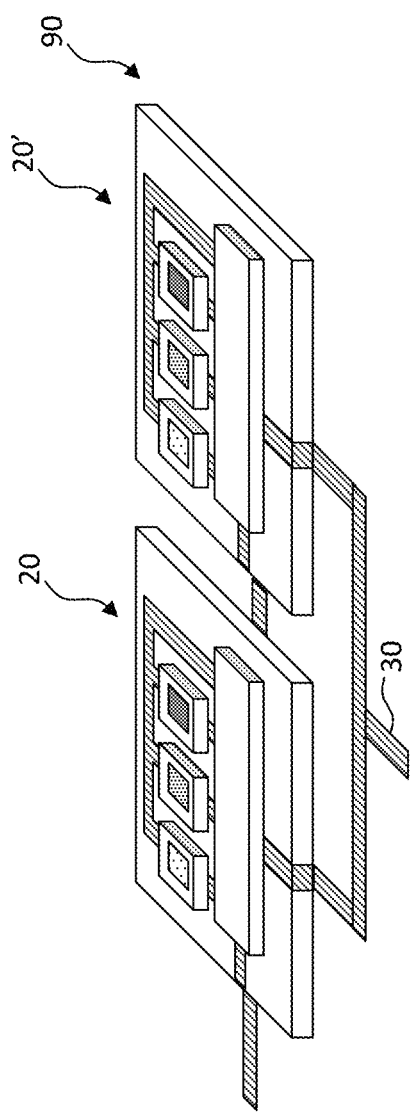
FIG. 12A is a schematic perspective of redundant pixels, according to illustrative embodiments of the present invention.

The manufacturing yield of matrix-addressed tiles 99 can be improved by providing redundant elements or locations electrically connected in parallel with the elements. Referring to FIG. 12A, in some embodiments of the present invention, a pixel 20 is provided together with a redundant pixel 20'. If pixel 20 fails, the redundant pixel 20' can perform its function (or vice versa). Thus, in some embodiments of the present invention, pixels 20 are first pixels 20 and a matrix-addressed tile 99 further comprises a two-dimensional array of redundant pixels 20', each redundant pixel 20' electrically connected in parallel with a first pixel 20.

In some embodiments, a repair location 90 with parallel electrical connections can be provided and a repair pixel 20 disposed in the repair location 90 if the pixel 20 fails or is otherwise inoperable or dysfunctional. In some such embodiments, each pixel 20 is located in a first pixel location having first electrical connections and the matrix-addressed tile 99 further comprises a two-dimensional array of redundant pixel repair locations 90, each redundant pixel repair location 90 having redundant electrical connections electrically connected in parallel with the first electrical connections.

Figure 12B:
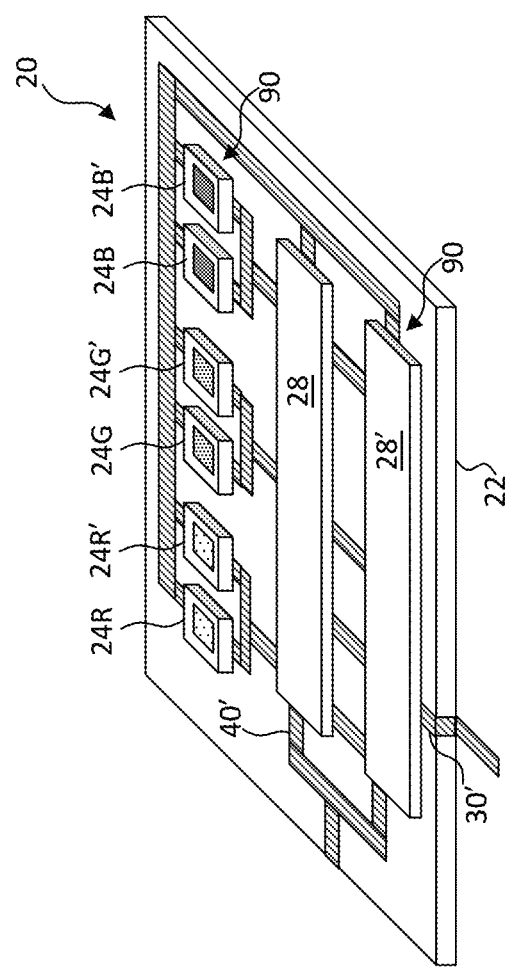
FIG. 12B is a schematic perspective of a pixel with redundant components, according to illustrative embodiments of the present invention.

Pixels 20 can also include redundant components or repair locations 90. Referring to FIG. 12B, a redundant pixel controller 28' is electrically connected in parallel with the pixel controller 28. Similarly, redundant red, green, and blue pixel elements 24R', 24G', and 24B' are electrically connected in parallel with the red, green, and blue pixel elements 24R, 24G, and 24B, respectively. If any one of the elements fails or is otherwise inoperable or dysfunctional, the redundant element can perform its function (or vice versa).

FIG. 12C illustrates a redundant column-data circuit 34' and repair location 90 electrically connected in parallel to the serial column line 38 and column-data line 30 in a column tile 97. Therefore, in some embodiments, a pixel controller 28 column-data circuit is a first column-data circuit and a matrix-addressed column tile 97 further comprises a redundant column-data circuit 34' electrically connected in parallel with a first column-data circuit 34. In some embodiments, each column-data circuit 34 is located in a first column-data circuit location having first electrical connections and a matrix-addressed column tile 97 further comprises a redundant column-data circuit location 90, each redundant column-data circuit location having redundant electrical connections electrically connected in parallel with the first electrical connections.

Similarly, FIG. 12D illustrates a redundant row-select circuit 44' and repair location 90 electrically connected in parallel to the serial row line 48 and row-select line 40 in a row tile 98. In some such embodiments, the row-select circuit 44 is a first row-select circuit 44 and a redundant row-select circuit 44' is electrically connected in parallel with the first row-select circuit 44. In some such embodiments, each row-select circuit 44 is located in a first row-select circuit location having first electrical connections and the matrix-addressed row tile 98 further comprises a redundant row-select circuit repair location 90, each redundant row-select circuit repair location 90 having redundant electrical connections electrically connected in parallel with the first electrical connections.

In some embodiments, a corner tile 96 includes the redundant elements or repair locations 90 of both FIGS. 12C and 12D.

Referring to FIGS. 13A-13D, matrix-addressed tiles 99 according to certain embodiments of the present invention are combined into a larger tiled array, for example a display or sensor. A serial shift register of column-data circuits 34 can include a serial output electrically connected to a column-data circuit contact pad 36 and a serial input electrically connected to a column-data circuit contact pad 36. Similarly, a serial shift register of row-select circuits 44 can include a serial output electrically connected to a row-select circuit contact pad 46 and a serial input electrically connected to a row-select circuit contact pad 46. Thus, input and output connections of row-select and column data lines 40, 30 and serial row and serial column lines 48, 38 of different matrix-addressed tiles 99 can be electrically connected together through the corresponding contact pads to form a daisy chain of matrix-addressed tiles 99 forming a larger tiled array.

Figure 13A:
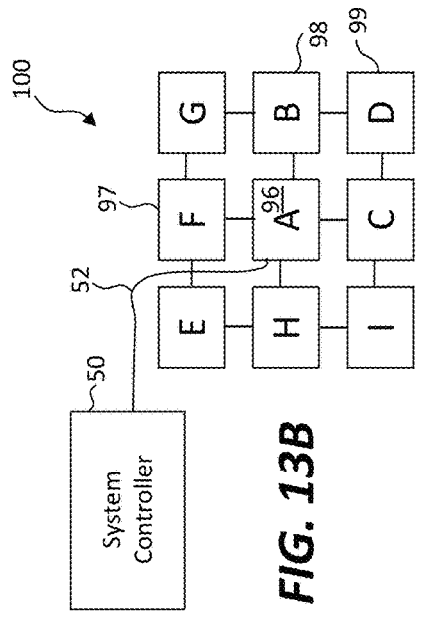
FIGS. 13A-13D are arrangements of tiles, according to illustrative embodiments of the present invention.
Figure 13B:
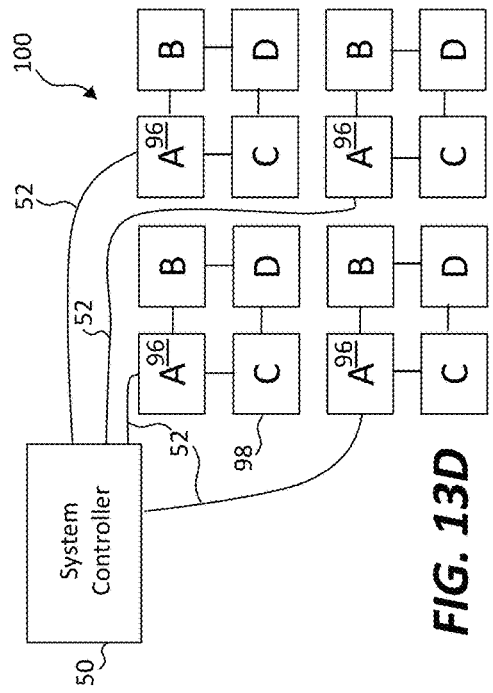

Referring specifically to FIG. 13A, a system controller 50 provides information and control signals (e.g., data signals 52) through control lines to the column-data circuit 34 and row-select circuit 44 of tile A, a corner tile 96. The signals can be communicated either serially or in parallel through electrical conductors or a bus. A system controller 50 can provide a control bit (or a token) to a row-select circuit 44 that is shifted serially through the serial shift register formed by the row-select circuits 44 to select sequential rows of pixels 20. A system controller 50 can include a memory for storing calibration and display pixel data values for the display that are communicated to a column-control circuit 30.

Column tiles 97 B and C are connected in a daisy chain to tile A through row-select line contact pads 42 and column-data circuit contact pads 36. Row tiles 98 D and G are connected in a daisy chain to tile A through column-data line contact pads 32 and row-select circuit contact pads 46. Matrix-addressed tiles 99 E and F are connected to column tiles 97 B and C through column-data line contact pads 32 and matrix-addressed tiles 99 E and H are connected to row tiles 98 D and G through row-select line contact pads 42. Matrix-addressed tiles 99 E and F are connected through row-select line contact pads 42, as are tiles H and I. Matrix-addressed tiles 99 E and H are connected through column-select line contact pads 32, as are tiles F and I.

The exemplary arrangement of FIG. 13A has a single corner tile 96 corresponding to FIG. 5A located at a corner (A) of the array of matrix-addressed tiles 99. The row (D, G) and column (B, C) tiles 98, 97, can correspond to FIGS. 2A and 3A, respectively. In another exemplary arrangement, referring to FIG. 13B, the "corner" tile A corresponds to FIG. 4B and is located at the center of the array of matrix-addressed tiles 99. F can be a column tile 97, as can C (in an upside-down arrangement). H can be a row tile 98, as can B (in a reversed arrangement). E, G, I, and D can be matrix-addressed tiles 99 as illustrated in FIG. 1.

Figure 13C:
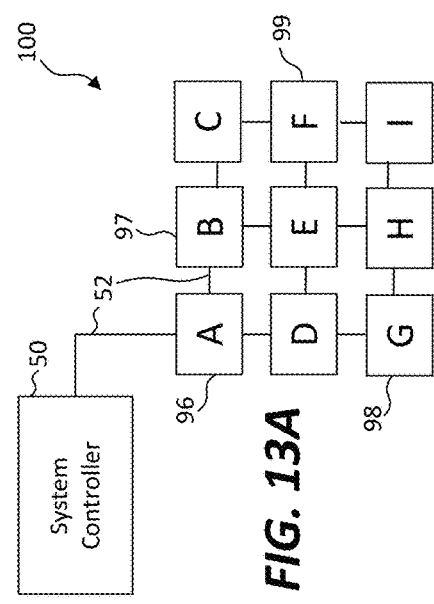
Figure 13D:
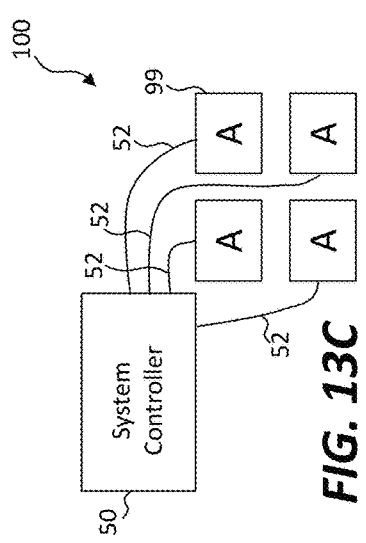

The exemplary embodiments of FIGS. 13C and 13D both include more than one corner tile 96. In FIG. 13C, all of the tiles are corner tiles 96 driven directly from the system controller 50. In this exemplary embodiment, the tile illustrated in FIG. 5A can be used and the row-select and column-data line contact pads 42, 32 are unnecessary as are one each of the two row-select circuit contact pads 46 and column-data circuit contact pads 36. FIG. 13D illustrates a tile array with sub-arrays, each corresponding to the array of FIG. 13A. The use of multiple corner tiles 96 connected to a system controller can increase the possible size of the tile array by reducing signal propagation delays or signal corruption between matrix-addressed tiles 99 or groups of matrix-addressed tiles 99 in the tile array.

Thus, in some embodiments of the present invention, a matrix-addressed tiled system 100 comprises two or more matrix-addressed tiles 99 that each include a column-data line contact pad 32 on one of the matrix-addressed tiles 99 electrically connected to a column-data line contact pad 32 of another different matrix-addressed tile 99. In some embodiments, a row-select line contact pad 42 on one matrix-addressed tile 99 is electrically connected to a row-select line contact pad 42 of another different tile. In some embodiments, three or more matrix-addressed tiles 99 each include a column-data line contact pad 32 on one of the matrix-addressed tiles 99 electrically connected to a column-data line contact pad 32 of another different matrix-addressed tile 99 and a row-select line contact pad 42 on one of the matrix-addressed tile 99 is electrically connected to a row-select line contact pad 42 of another different tile.

In some embodiments, a matrix-addressed tiled system 100 comprises a column tile 97 with a column-data line contact pads 32 electrically connected to column data line contact pads 32 of a different column tile 97. Likewise, a row tile 98 includes row-select line contact pads 42 electrically connected to row select line contact pads 42 of a different row tile 98. Similarly, a corner tile 96 has column-data line contact pads 32 electrically connected to column data line contact pads 32 of a different column tile 97 and row-select line contact pads 42 electrically connected to row-select line contact pads 42 of a different row tile 98.

In some embodiments of a matrix-addressed tiled system 100, a system controller 50 is electrically connected to a corner tile 96. In some embodiments, a matrix-addressed tiled system 100 includes a plurality of corner tiles 96 and the system controller 50 is electrically connected to each of the corner tiles 96. The plurality of matrix-addressed tiles 99 is arranged in an array and at least one of the corner tiles 96 is at the corner of the array of matrix-addressed tiles 99, at an edge of the array of matrix-addressed tiles 99, or within the array of matrix-addressed tiles 99 and not on an edge of the array of matrix-addressed tiles 99.

Figure 14:
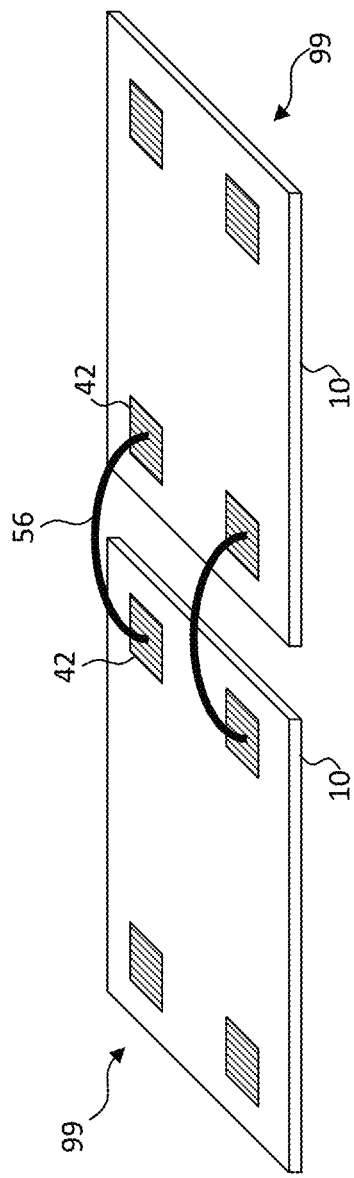
FIGS. 14 and 15 are perspectives of electrically connected tiles, according to illustrative embodiments of the present invention.
Figure 15:
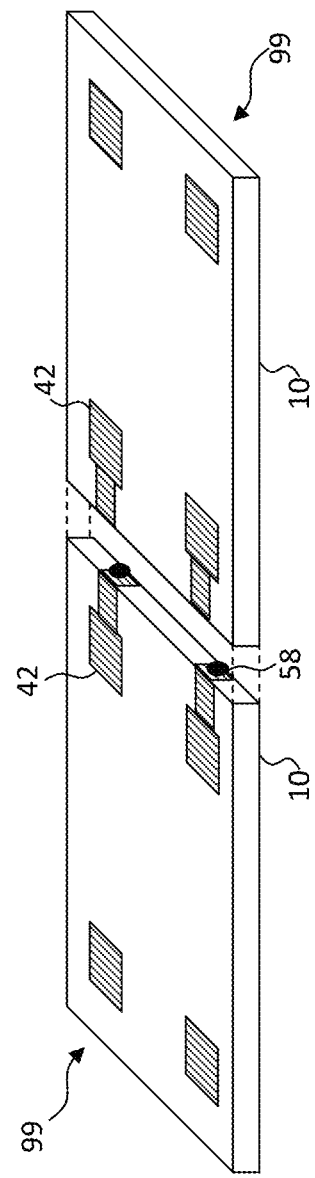

Referring to FIG. 14, electrical connections between adjacent matrix-addressed tiles 99 in a matrix-addressed tiled system 100 can be made with wire electrical connections such as wire-bond wires 56 that are attached to a tile substrate 10 only at a contact pads. In some embodiments, referring to FIG. 15, at least some of the electrical connection between respective matrix-addressed tiles 99 are butted electrical connections 58 formed on a side of a tile substrate 10 on which pixels 20 are not disposed, for example an edge side. A butted electrical connections 58 can include deformable, conformable, or compliant electrical conductors, or the butted electrical connections 58 of adjacent matrix-addressed tiles 99 can be soldered together.

A matrix-addressed tiled system 100 can be a display system or a sensor system.

Figure 16:
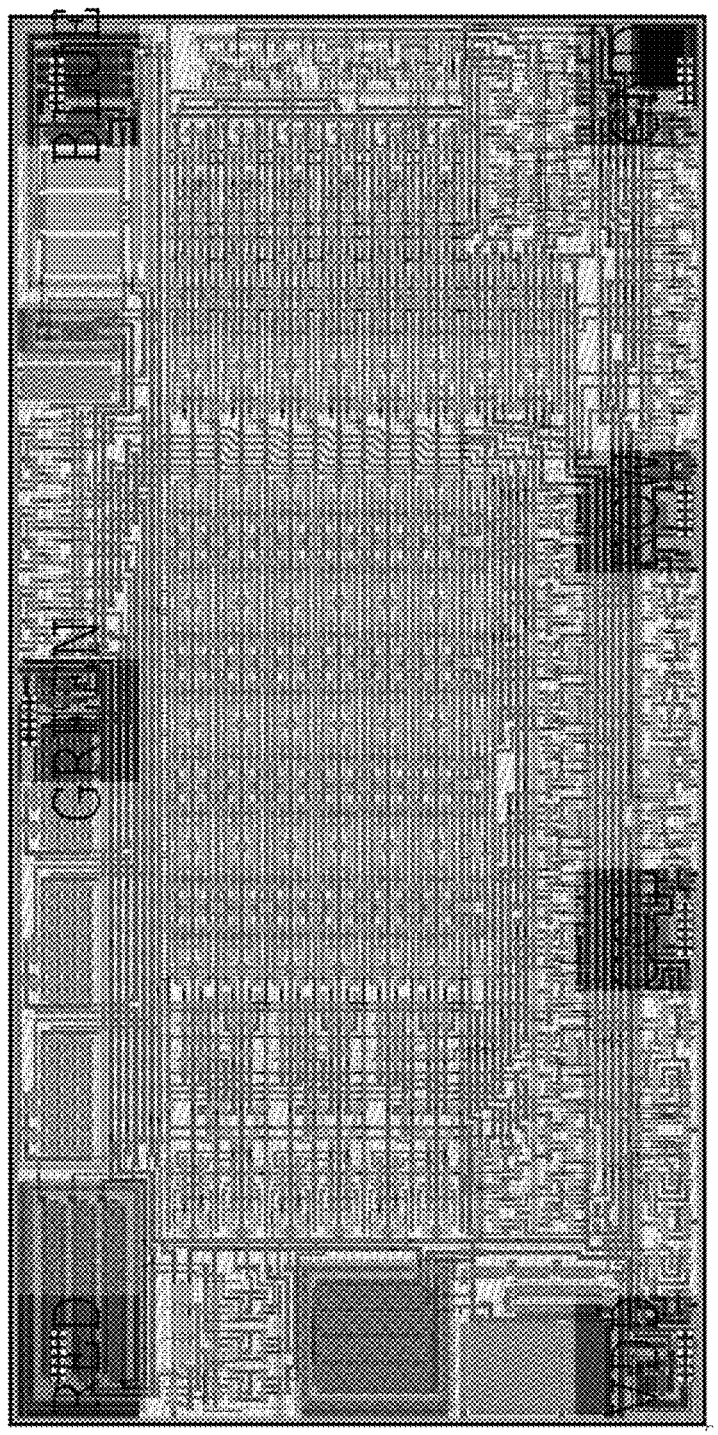
FIG. 16 is a layout of a pixel controller, according to illustrative embodiments of the present invention.
Figure 17:
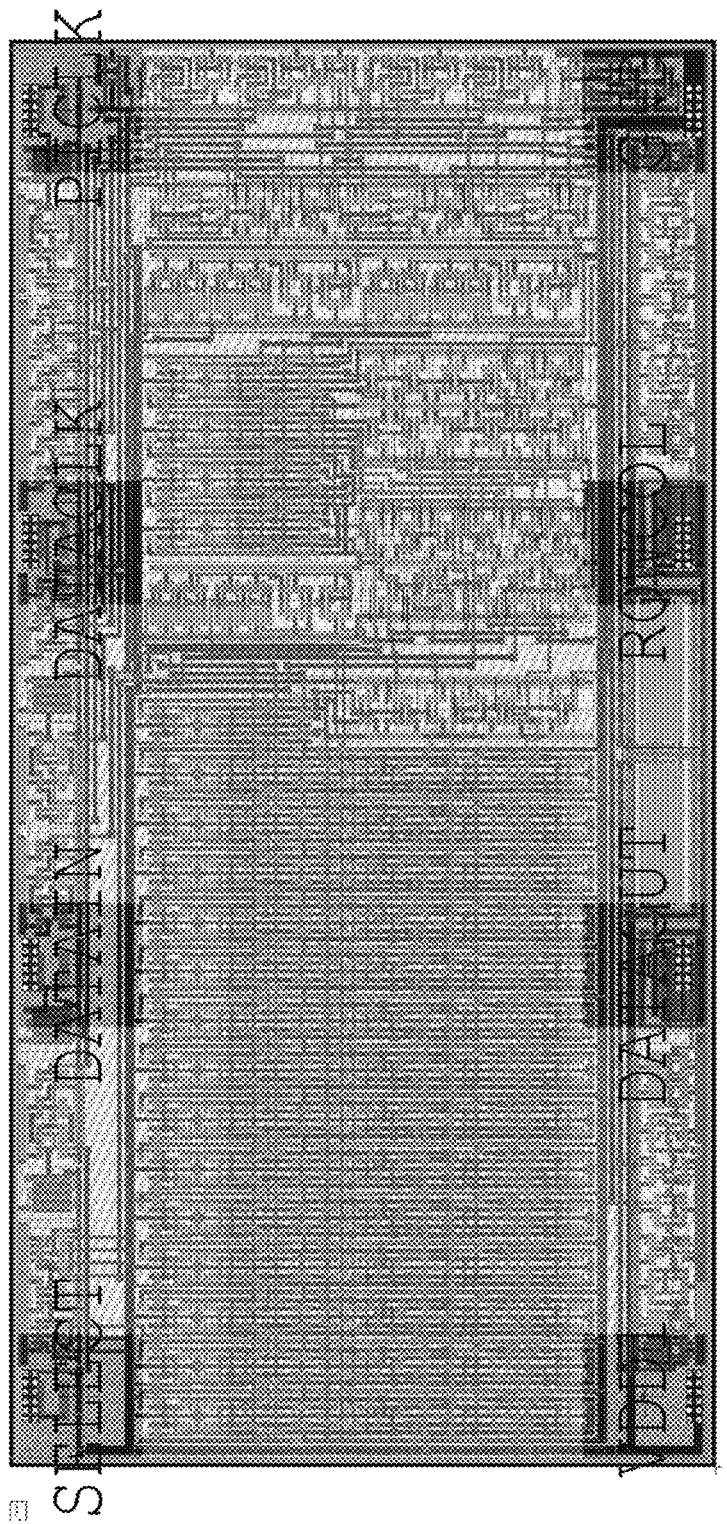
FIG. 17 is a layout of a row-select circuit and a column-data circuit, according to illustrative embodiments of the present invention.

A pixel controller 28, column-data circuit 34, and row-select circuit 44 have been designed and constructed. FIG. 16 illustrates a layout of a micro-transfer printable pixel controller 28 that can drive red, green, and blue micro-transfer printed micro-LEDs (e.g., pixel elements 24) with a 14-bit PWM value at one of four current densities. FIG. 17 is a circuit layout of a row-select circuit 44 and a column-data circuit 34 in a common micro-transfer printable integrated circuit.

A tile substrate 10 can, for example, be or comprise glass, metal, polymer, resin, cured resin, or ceramic, or any substrate having opposing sides and a surface suitable for disposing pixels 20 and forming wires and contact pads thereon. Pixels 20 can be light-emitting pixels 20 or sensors responsive to electromagnetic radiation such as visible light, infrared radiation, ultraviolet radiation, or x-rays. Thus, in some embodiments of the present invention, pixel elements 24 are light emitters such as light-emitting diodes (LEDs), for example, micro-LEDs. In some embodiments, pixel elements 24 are light sensors such as photo-sensors sensitive to visible light, infrared light, ultraviolet light, x-rays, or electromagnetic radiation. As used herein, a light sensor is sensitive to visible electromagnetic radiation (i.e., visible light) or non-visible electromagnetic radiation (e.g., infrared light, ultraviolet light, or x-rays). A light sensor is any device that converts incident electromagnetic radiation to an electrical signal (e.g., voltage or current) and is not limited to particular classes of photo-sensors such as photo-diodes.

Matrix-addressed tiled systems 100 according to certain embodiments of the present invention can be addressed using passive-matrix addressing or active-matrix addressing. In an exemplary passive-matrix address scheme, each pixel 20 (e.g., light emitter or light sensor) is directly addressed using a row-select line 40 and a column-data line 30. When data (information) is written to a row, the row-select line 40 corresponding to the row selects all of the pixels 20 in the row and each of the column lines 30 provides the data or information (for example an analog voltage or current or digital voltage value) to each of the pixels 20 in the row. The next row is then selected and the process repeated for each row. Thus, in a passive-matrix controlled device the pixel elements 24 are only active when they are part of a selected row.

In an active-matrix address scheme according to certain embodiments of the present invention, each pixel 20 includes a circuit for information storage. The information is provided by column-data lines 30 under the control of a column-data circuit 34 to each pixel 20 in a row that is selected by a row-select line 40 under the control of a row-select circuit 44. When data (information) is written to a row, the row-select line 40 corresponding to the row selects all of the pixels 20 in the row and each of the column-data lines 30 provides the data or information (for example an analog voltage or current or a digital value such as a voltage) to each of the pixels 20 in the row. Each of the pixels 20 then stores the value and uses the stored value to drive the pixel elements 24 (e.g., a light emitter or light sensor) of the pixel element 24. The next row is then selected and the process repeated for each row. Thus, in an active-matrix controlled device the pixel elements 24 can be active when they are not selected since the information used to control the pixel elements 24 is stored and available in the pixel 20 even when the pixel 20 is not selected. In an exemplary analog arrangement, a column-data circuit 34 and a row-select circuit 44 can each include a serially connected analog shift register using charged capacitors to provide the information or row-select signals and pixel 20 can include a storage circuit to store the information, for example in a capacitor. In an exemplary digital implementation, a column-data circuit 34 can include a serially connected digital shift register using flip-flops or digital latches to provide the information and a pixel 20 can include a storage circuit to store the information, for example in a flip-flop 70 or digital latch. In some embodiments of the present invention, a column-data circuit 34 and a row-select circuit 44 provide active-matrix control to an array of pixels 20.

In certain active-matrix embodiments of the present invention, each pixel 20 includes a pixel controller 28 that is connected to pixel elements 24 of the pixel 20, that is connected to a column driver 72 corresponding to the column in which the pixel 20 is arranged, for example through column-data lines 30, and that is connected to a row-select line 40 corresponding to the row in which the pixel 20 is arranged. A pixel controller 28 can include a pixel storage element 70 that stores information in response to signals provided by a row-select circuit 44 through a row-select line 40 and column-data circuit 34 to which it is connected by a column line 30. A pixel storage element 70 can include (in analog embodiments) a capacitor or (in digital embodiments) a flip-flop 70 or latch such as a digital latch. Pixel storage elements 70 can be the same kind of storage circuit as row storage elements 70 or column storage elements 70, or they can be different.

In some embodiments of the present invention, pixel elements 24 are light-emitting diodes (LEDS, for example micro-LEDs) that are formed in or on one or more pixel element substrates that are separate, distinct, and independent of a tile substrate 10. Likewise, a pixel controller 28 can be formed in or on one or more pixel substrates that are separate, distinct, and independent of a tile substrate 10. The various separate, distinct, and independent substrates of certain embodiments of the present invention can be bare die, for example unpackaged integrated circuit substrates such as semiconductor substrates. FIG. 7 illustrates an exemplary embodiment with a single pixel element 24 controlled by each pixel controller 28 in each pixel 20. In the exemplary embodiment illustrated in FIG. 8, each pixel controller 28 in each pixel 20 can control a plurality of pixel elements 24, for example corresponding to red, green, or blue pixel elements 24R, 24G, 24B such as red, green, or blue light emitters that emit red, green, or blue light, respectively, or red, green, or blue light sensors that are sensitive to red, green, or blue light, respectively, to form a full-color pixel 20. In FIGS. 7 and 8, the pixel elements 20 can be electrically connected to the pixel controller 28 through electrical conductors, such as pixel wires 26 formed by photolithography or cured ink deposited by inkjet devices.

In some embodiments of the present invention, a method of making a matrix-addressed tile 10 includes providing a tile substrate 10 and disposing an array of pixels 20 on the tile substrate 10. The array of pixels 20 can be disposed on the tile substrate 10 by micro-transfer printing, for example micro-transfer printing chiplets, bare die, or unpackaged integrated circuits. In some embodiments, pixel 20 components (e.g., a pixel controller 28 and pixel elements 24) are micro-transfer printed or formed on a pixel substrate 22 that is then disposed on a tile substrate 10. A row-select circuit 44 or column-data circuit 34 is disposed on the tile substrate 10, for example by forming the row-select circuit 44 or column-data circuit 34 on the tile substrate 10, locating components on the tile substrate 10 for example using pick-and-place techniques for discrete or integrated circuit components, or by micro-transfer printing one or more circuits, for example micro-transfer printing a plurality of bare die chiplets or integrated circuits rom corresponding source wafers. In some embodiments, a row-select circuit 44 or column-data circuit 34 is micro-transfer printed onto a tile substrate 10 by printing a plurality of row-select substrates or column-data substrates onto the tile substrate 10. A system controller 50 is provided and the system controller 50, pixels 20, and a row-select circuit 44 or column-data circuit 34 are electrically connected, for example using photolithographic techniques.

In certain embodiments, a tile substrate 10 includes material, for example glass or plastic, different from a material in an integrated-circuit substrate, for example a semiconductor material such as silicon or GaN. Pixel elements 24 can be formed separately on separate semiconductor substrates, assembled onto a pixel substrate 22, for example by micro-transfer printing, and then the assembled unit is located on the surface of a tile substrate 10. Such an arrangement has the advantage that pixel elements 24 can be separately tested on a pixel substrate 22 and the pixel substrates 22 accepted, repaired, or discarded before the pixel substrate 22 is located on a tile substrate 10, thus improving yields and reducing costs.

In an exemplary method according to certain embodiments of the present invention pixel substrates 22 are formed and disposed on a tile substrate 10 by micro transfer printing using compound micro assembly structures and methods, for example as described in U.S. patent application Ser. No. 62/055,472 filed Sep. 25, 2014, entitled Compound Micro-Assembly Strategies and Devices. In some embodiments, pixel substrates 22 are disposed on a tile substrate 10 using pick-and-place methods found in the printed-circuit board industry, for example using vacuum grippers. Pixel substrates 22 on a tile substrate 10 can be interconnected using photolithographic methods and materials or printed circuit board methods and materials.

Although not specifically illustrated in the Figures, the provision of the matrix-addressed tiles 10 can include forming conductive wires on a tile substrate 10 or pixel substrate 22 using photolithographic and display substrate processing techniques, for example photolithographic processes employing metal or metal oxide deposition using evaporation or sputtering, curable resin coatings (e.g., SU8), positive or negative photo-resist coating, radiation (e.g., ultra-violet radiation) exposure through a patterned mask, and etching methods to form patterned metal structures, vias, insulating layers, and electrical interconnections. Inkjet and screen-printing deposition processes and materials can be used to form patterned conductors or other electrical elements. Pixel wires 26 on pixel substrates 22 can be fine interconnections, for example having a width of less than 50 microns, less than 20 microns, less than 10 microns, less than five microns, less than two microns, or less than one micron. Such fine interconnections are useful for interconnecting chiplets, for example as bare dies with contact pads and used with the tile substrate 10 or pixel substrate 22. In some embodiments, wires, for example on a tile substrate 10 can include one or more coarse lithography interconnections having a width from 2 μm to 2 mm (e.g., 100 μm to 2 mm), wherein each coarse lithography interconnection electrically connects pixel elements 24, column-data circuits 34, or row-select circuits 44 to a tile substrate 10 or pixel substrate 22.

A system controller 50 can be external to a tile substrate 10 (for example on a separate printed circuit board substrate). In some such embodiments, a system controller 50 is electrically connected to the tile substrate 10 using connectors, ribbon cables, or the like.

In some embodiments, pixel elements 24 (e.g., micro-LEDs or micro-photo-sensors) are transfer printed to pixel substrates 22 or a tile substrate 10 in one or more transfers. U.S. Pat. Nos. 8,722,458, 7,622,367 and 8,506,867 disclose micro-transfer printing techniques, the disclosure from each of which is hereby incorporated by reference. The transferred pixel elements 24 can then be interconnected, for example with electrical conductors on the pixel substrates 22 or tile substrate 10 including row-select lines 40 and column lines 30 and optionally including connection pads and other electrical connection structures, to enable a system controller 50 to electrically interact with the pixel elements 24 to emit or receive light. In a process according to some embodiments, transfer of pixel elements 24 is performed before or after all of the electrical conductors are in place. Thus, in some embodiments, the construction of electrical conductors can be performed before pixel elements 24 are printed or after the pixel elements 24 are printed or both.

According to various embodiments of the present invention, a tile substrate 10 usefully has two opposing smooth sides suitable for material deposition, photolithographic processing, or micro-transfer printing of micro-LEDs or photo-sensors. A tile substrate 10 can have a size of a conventional display or sensor array, for example a rectangle with a diagonal of a few centimeters to one or more meters. Such substrates are commercially available. A tile substrate 10 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, pixel elements 24 emit or receive light through a tile substrate 10. In some embodiments, pixel elements 24 emit or receive light in a direction opposite a tile substrate 10. A tile substrate 10 can have a thickness of less than or equal to 20 mm, less than or equal to 1 mm, less than or equal to 100 microns or less than or equal to 10 microns. For example a tile substrate 10 can have a thickness from 5 to no more than 10 microns, 10 to no more than 50 microns, 50 to no more than 100 microns, 100 to no more than 200 microns, 200 to no more than 500 microns, 0.5 to no more than 1 mm, 1 mm to no more than 5 mm, 5 mm to no more than 10 mm, or 10 mm to no more than 20 mm. According to some embodiments of the present invention, a tile substrate 10 includes layers formed on an underlying structure or substrate, for example a rigid or flexible glass or plastic substrate.

In some embodiments, a tile substrate 10 has a single, connected, contiguous pixel area 12 that includes pixel elements 24 and pixel elements 24 each have a light-emissive or light-receptive area, wherein the combined light-emissive areas of the plurality of pixel elements 24 is less than or equal to one-quarter of the contiguous system substrate area. In some embodiments, the combined light-emissive or light-receptive areas of a plurality of pixel elements 24 is less than or equal to one eighth, one tenth, one twentieth, one fiftieth, one hundredth, one five-hundredth, one thousandth, one two-thousandth, or one ten-thousandth of the contiguous system substrate area of a tile substrate 10. The light-emissive or light-receptive area of the pixel elements 24 can be only a portion of the pixel elements 24 (e.g., from which light is emitted). In a typical light-emitting diode, for example, not all of the semiconductor material in the light-emitting diode necessarily emits light. As such, in some embodiments, pixel elements 24 occupy less than one quarter of the system substrate area of a tile substrate 10.

In some embodiments of the present invention, pixel elements 24 are micro-light-emitting diodes (micro-LEDs) or photo-sensors, for example having light-emissive or light-sensitive areas of less than 10, 20, 50, or 100 square microns. In some embodiments, pixel elements 24 have physical dimensions that are less than 200 μm, less than 150 μm, or less than 100 μm, for example having at least one of a width from 2 to no more than 5 μm, 5 to no more than 10 μm, 10 to no more than 20 μm, or 20 to no more than 50 μm, a length from 2 to no more than 5 μm, 5 to no more than 10 μm, 10 to no more than 20 μm, or 20 to no more than 50 μm, and a height from 2 to no more than 5 μm, 5 to no more than 10 μm, 10 to no more than 20 μm, or 20 to no more than 50

μm. Pixel elements 24 can have a size of one square micron to 500 square microns. Such micro-pixel elements 24 have the advantage of a small light-emissive or light-sensitive area compared to their brightness or sensitivity. Moreover, pixel elements 24 that are micro-light-emitting diodes can provide excellent color purity, highly saturated colors, and a substantially Lambertian emission providing a wide viewing angle.

According to various embodiments, matrix-addressed tiles 99 or a matrix-addressed tiled system 100, for example as used in a display or sensor array, includes a variety of designs having a variety of resolutions, pixel element 24 sizes, and a range of tile substrate areas. For example, tile substrate areas ranging from 1 cm by 1 cm to 1 m by 1 m (or larger) in size are contemplated. In general, larger pixel elements 24 are most useful with, but are not limited to, larger tile substrate areas. The resolution of pixel elements 24 over a tile substrate 10 can also vary, for example from 50 pixel elements 24 per inch to hundreds of pixel elements 24 per inch, or even thousands of pixel elements 24 per inch. For example, a three-color display can have one thousand 10 μm×10 μm pixel elements 24 per inch (on a 25-micron pitch). Thus, certain embodiments of the present invention have application in both low-resolution and very high-resolution displays or sensor arrays. An approximately one-inch 128-by-128-pixel display having 3.5 micron by 10-micron emitters has been constructed and successfully operated without redundant emitters as described in U.S. Patent Application Ser. No. 62/148,603 filed Apr. 16, 2015, entitled Micro-Assembled Micro LED Displays and Lighting Elements.

In some embodiments, pixel elements 24 are separately formed in a semiconductor wafer. The pixel elements 24 are then removed from the wafer and transferred, for example using micro transfer printing, to a tile substrate 10 or pixel substrate 22. Such a method has the advantage of enabling use of a crystalline semiconductor substrate that provides higher-performance integrated circuit components than can be made in the amorphous or polysilicon semiconductor available on a large substrate such as the tile substrate 10.

By employing a multi-step transfer or assembly process, increased yields are achieved and thus reduced costs for the parallel redundant integrated-circuit system 5 of the present invention. Additional details useful in understanding and performing aspects of certain embodiments of the present invention are described in U.S. Patent Application Ser. No. 62/148,603 filed Apr. 16, 2015, entitled Micro-Assembled Micro LED Displays and Lighting Elements.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

10 tile substrate
12 pixel area
20 pixel
20' redundant pixel
22 pixel substrate
24 pixel element/micro-light-emitting diode
24R red pixel element/micro-light-emitting diode
24G green pixel element/micro-light-emitting diode
24B blue pixel element/micro-light-emitting diode
26 pixel wire
28 pixel controller
28' redundant pixel controller
30 column-data line
30' column-data line
32 column-data line contact pad
34 column-data circuit
34' redundant column-data circuit
36 column-data circuit contact pad
38 serial column line
40 row-select line
40' row-select line
42 row-select line contact pad
44 row-select circuit
44' redundant row-select circuit
46 row-select circuit contact pad
48 serial row line
50 system controller
51 select signal
52 data signal
53 clock signal
53A first clock signal
53B second clock signal
54 electrical jumper
56 wire-bond wire
70 flip-flop/storage element
70A first flip-flop
70B second flip-flop
72 driver/column-driver circuit
74 pulse-width-modulation generator
76 state machine controller
80 integrated circuit
82 emitted/sensed light
84 through-substrate via
90 repair location
96 corner tile
97 column tile
98 row tile
99 matrix-addressed tile
100 matrix-addressed tile system

What is claimed:

1. A matrix-addressed tile, comprising:
   a tile substrate;
   a two-dimensional array of pixels, arranged in rows and columns, disposed on the tile substrate, the array of pixels defining a contiguous pixel area of the tile substrate such that each pixel in the array of pixels is disposed within the contiguous pixel area;
   a one-dimensional array of column-data lines disposed on the tile substrate, wherein at least a portion of the one-dimensional array of column-data lines is within the contiguous pixel area and each column-data line is electrically connected to each pixel in one of the columns;
   a one-dimensional array of row-select lines disposed on the tile substrate, wherein at least a portion of the one-dimensional array of row-select lines is within the contiguous pixel area and each row-select line is electrically connected to each pixel in one of the rows;
   at least one column-data line contact pad electrically connected to each of the column-data lines, each column-data line contact pad disposed at least partially within the pixel area and between at least two pixels; and
   at least one row-select line contact pad connected to each of the row-select lines, each row-select line contact pad disposed at least partially within the pixel area and between at least two pixels.

2. The matrix-addressed tile of claim 1, wherein the matrix-addressed tile is:
   a column tile comprising a plurality of serially connected column-data circuits disposed on the tile substrate at least partially in the pixel area and between at least two pixels, each column-data circuit electrically connected to a column-data line and a column-data line contact pad;
   a row tile comprising a plurality of serially connected row-select circuits disposed on the tile substrate at least partially in the pixel area and between at least two pixels, each row-select circuit electrically connected to a row-select line and a row-select line contact pad; or
   a corner tile comprising a plurality of serially connected column-data circuits disposed on the tile substrate at least partially in the pixel area and between at least two pixels, each column-data circuit electrically connected to a column-data line and a column-data line contact pad; and a plurality of serially connected row-select circuits disposed on the tile substrate at least partially in the pixel area and between at least two pixels, each row-select circuit electrically connected to a row-select line and a row-select line contact pad.

3. The matrix-addressed tile of claim 2, wherein the matrix-addressed tile is the column tile and the plurality of serially connected column-data circuits of the column tile comprises: i) a serial shift register comprising a serial input and a serially connected column storage element corresponding to each column of pixels in the array of pixels, and ii) a plurality of column-driver circuits, each column-driver circuit responsive to a column storage element and electrically connected to a column-data line that provides column-data signals in common to all of the pixels in the column of pixels or receives column-data signals in common from all of the pixels in the column of pixels.

4. The matrix-addressed tile of claim 3, wherein the serial shift register of the column-data circuits comprises a serial output electrically connected to a column-data circuit contact pad.

5. The matrix-addressed tile of claim 2, wherein the matrix-addressed tile is the column tile and:
   each column-data circuit comprises a serially connected integrated circuit chiplet disposed on the tile substrate or a serially connected native circuit formed on or in the tile substrate, each integrated circuit chiplet or native circuit electrically connected to a column-data line.

6. The matrix-addressed tile of claim 5, wherein each integrated circuit chiplet or native portion is electrically connected to one or two column-data lines or is electrically connected to one or two row-select lines.

7. The matrix-addressed tile of claim 2, wherein the matrix-addressed tile is the row tile and the plurality of serially connected row-select circuits of the row tile comprises: i) a serial shift register comprising a serial input and a serially connected row storage element corresponding to each row in the array of pixels, and ii) a plurality of row-driver circuits, each row-driver circuit responsive to a row storage element and electrically connected to a row-select line that provides row-control signals in common to all of the pixels in the row.

8. The matrix-addressed tile of claim 7, wherein the serial shift register of the row-select circuits comprises a serial output electrically connected to a row-select circuit contact pad.

9. The matrix-addressed tile of claim 2, wherein the matrix-addressed tile is the corner tile and:
   the plurality of serially connected column-data circuits comprises i) a serial shift register comprising a serial input and a serially connected column storage element corresponding to each column of pixels in the array of pixels, and ii) a plurality of column-driver circuits, each column-driver circuit responsive to a column storage element and electrically connected to a column-data line that provides column-data signals in common to all of the pixels in the column of pixels or receives column-data signals in common from all of the pixels in the column of pixels, and the plurality of serially connected row-select circuits comprises: i) a serial shift register comprising a serial input and a serially connected row storage element corresponding to each row in the array of pixels, and ii) a plurality of row-driver circuits, each row-driver circuit responsive to a row storage element and electrically connected to a row-select line that provides row-control signals in common to all of the pixels in the row.

10. The matrix-addressed tile of claim 2, wherein the matrix-addressed tile is the row tile and:
    each row-select circuit comprises a serially connected integrated circuit chiplet disposed on the tile substrate or a serially connected native circuit formed on or in the tile substrate, each integrated circuit chiplet or native circuit electrically connected to a row-select line.

11. The matrix-addressed tile of claim 2, wherein the matrix-addressed tile is the corner tile and:
    a) each column-data circuit comprises a serially connected integrated circuit chiplet disposed on the tile substrate or wherein each column-data circuit comprises a serially connected native circuit formed on or in the tile substrate, each integrated circuit chiplet or native circuit electrically connected to a column-data line;
    b) each row-select circuit comprises a serially connected integrated circuit chiplet disposed on the tile substrate or wherein each row-select circuit comprises a serially connected native circuit formed on or in the tile substrate, each integrated circuit chiplet or native circuit electrically connected to a row-select line; or c) both a) and b).

12. The matrix-addressed tile of claim 1, wherein the pixels each comprise one or more pixel elements comprising at least one of light-emitter, an inorganic light-emitting diode, a photo-diode, and a photo-transistor.

13. The matrix-addressed tile of claim 12, wherein the one or more pixel elements each comprise a pixel element substrate that is distinct, separate, and independent of the tile substrate.

14. The matrix-addressed tile of claim 12, comprising a pixel substrate and wherein the one or more pixel elements of each pixel are disposed on the pixel substrate, the pixel substrate distinct, separate, and independent of the tile substrate and distinct, separate, and independent of the one or more pixel elements, and the pixel substrate is disposed on the tile substrate.

15. The matrix-addressed tile of claim 1, comprising:
   a) two column-data line contact pads electrically connected to each of the column-data lines, each column-data line contact pad disposed at least partially within the pixel area and between at least two pixels;
   b) two row-select line contact pads electrically connected to each of the row-select lines, each row-select line contact pad disposed at least partially within the pixel area and between at least two pixels; or
   c) both a) and b).

16. A matrix-addressed tiled system, comprising:
   two or more tiles each comprising:
      a tile substrate;
      a two-dimensional array of pixels, arranged in rows and columns, disposed on the tile substrate, the array of pixels defining a contiguous pixel area of the tile substrate such that each pixel in the array of pixels is disposed within the contiguous pixel area;
      a one-dimensional array of column-data lines disposed on the tile substrate, wherein at least a portion of the one-dimensional array of column-data lines is within the contiguous pixel area and each column-data line is electrically connected to each pixel in one of the columns;
      a one-dimensional array of row-select lines disposed on the tile substrate, wherein at least a portion of the one-dimensional array of row-select lines is within the contiguous pixel area and each row-select line is electrically connected to each pixel in one of the rows;
      at least one column-data line contact pad electrically connected to each of the column-data lines, each column-data line contact pad disposed at least partially within the pixel area and between at least two pixels; and
      at least one row-select line contact pad connected to each of the row-select lines, each row-select line contact pad disposed at least partially within the pixel area and between at least two pixels,
   wherein, for each of the two or more tiles:
   a) a column-data line contact pad on one of the two or more tiles is electrically connected to a column-data line contact pad of a different one of the two or more tiles;
   b) a row-select line contact pad on one of the two or more tiles is electrically connected to a row-select line contact pad of a different one of the two or more tiles; or
   c) both a) and b).

17. The matrix-addressed tiled system of claim 16, wherein at least one of
   a) at least one of the two or more tiles is a column tile comprising a column tile comprising a plurality of serially connected column-data circuits disposed on the tile substrate at least partially in the pixel area and between at least two pixels, each column-data circuit electrically connected to a column-data line and a column-data line contact pad, wherein a column-data line contact pad electrically connected to each of the column-data lines of the column tile is electrically connected to a column data line contact pad of a different column tile,
   b) at least one of the two or more tiles is a row tile comprising a plurality of serially connected row-select circuits disposed on the tile substrate at least partially in the pixel area and between at least two pixels, each row-select circuit electrically connected to a row-select line and a row-select line contact pad, wherein a row-select line contact pad electrically connected to each of the row-select lines of the row tile is electrically connected to a row select line contact pad of a different row tile, and
   c) at least one of the two or more tiles is a corner tile comprising a plurality of serially connected column-data circuits disposed on the tile substrate at least partially in the pixel area and between at least two pixels, each column-data circuit electrically connected to a column-data line and a column-data line contact pad; and a plurality of serially connected row-select circuits disposed on the tile substrate at least partially in the pixel area and between at least two pixels, each row-select circuit electrically connected to a row-select line and a row-select line contact pad, wherein a column-data line contact pad electrically connected to each of the column-data lines of the corner tile is electrically connected to a column data line contact pad of a column tile and wherein a row-select line contact pad electrically connected to each of the row-select lines of the corner tile is electrically connected to a row select line contact pad of a row tile.

18. The matrix-addressed tiled system of claim 16, wherein the two or more tiles comprises a corner tile, the corner tile comprising:
   a plurality of serially connected column-data circuits disposed on the tile substrate at least partially in the pixel area and between at least two pixels, each column-data circuit electrically connected to a column-data line and a column-data line contact pad; and
   a plurality of serially connected row-select circuits disposed on the tile substrate at least partially in the pixel area and between at least two pixels, each row-select circuit electrically connected to a row-select line and a row-select line contact pad,
   wherein a column-data line contact pad electrically connected to each of the column-data lines of the corner tile is electrically connected to a column data line contact pad of a column tile and wherein a row-select line contact pad electrically connected to each of the row-select lines of the corner tile is electrically connected to a row select line contact pad of a row tile; and
   a system controller electrically connected to the corner tile.

19. The matrix-addressed tiled system of claim 16, wherein the two or more tiles comprises a corner tile, the corner tile comprising:

a plurality of serially connected column-data circuits disposed on the tile substrate at least partially in the pixel area and between at least two pixels, each column-data circuit electrically connected to a column-data line and a column-data line contact pad; and a plurality of serially connected row-select circuits disposed on the tile substrate at least partially in the pixel area and between at least two pixels, each row-select circuit electrically connected to a row-select line and a row-select line contact pad, wherein a column-data line contact pad electrically connected to each of the column-data lines of the corner tile is electrically connected to a column data line contact pad of a column tile and wherein a row-select line contact pad electrically connected to each of the row-select lines of the corner tile is electrically connected to a row select line contact pad of a row tile, wherein a plurality of tiles is arranged in an array and the corner tile is at a corner of the array of tiles, at an edge of the array of tiles, or within the array of tiles and not on an edge of the array of tiles.

20. The matrix-addressed tiled system of claim 16, wherein the two or more tiles comprises a plurality of corner tiles, each of the plurality of corner tiles comprising:

a plurality of serially connected column-data circuits disposed on the tile substrate at least partially in the pixel area and between at least two pixels, each column-data circuit electrically connected to a column-data line and a column-data line contact pad; and a plurality of serially connected row-select circuits disposed on the tile substrate at least partially in the pixel area and between at least two pixels, each row-select circuit electrically connected to a row-select line and a row-select line contact pad, wherein a column-data line contact pad electrically connected to each of the column-data lines of each corner tile is electrically connected to a column data line contact pad of a column tile and wherein a row-select line contact pad electrically connected to each of the row-select lines of each corner tile is electrically connected to a row select line contact pad of a row tile.

21. A matrix-addressed tiled system, comprising:

a plurality of corner tiles arranged in a one- or two-dimensional array, wherein the plurality of corner tiles are not electrically connected to each other and each of the plurality of corner tiles comprises:

a tile substrate;

a two-dimensional array of pixels, arranged in rows and columns, disposed on the tile substrate, the array of pixels defining a contiguous pixel area of the tile substrate such that each pixel in the array of pixels is disposed within the contiguous pixel area;

a one-dimensional array of column-data lines disposed on the tile substrate, wherein at least a portion of the one-dimensional array of column-data lines is within the contiguous pixel area and each column-data line is electrically connected to each pixel in one of the columns;

a one-dimensional array of row-select lines disposed on the tile substrate, wherein at least a portion of the one-dimensional array of row-select lines is within the contiguous pixel area and each row-select line is electrically connected to each pixel in one of the rows;

at least one column-data line contact pad electrically connected to each of the column-data lines, each column-data line contact pad disposed at least partially within the pixel area and between at least two pixels; and at least one row-select line contact pad connected to each of the row-select lines, each row-select line contact pad disposed at least partially within the pixel area and between at least two pixels;

a plurality of serially connected column-data circuits disposed on the tile substrate at least partially in the pixel area and between at least two pixels, each column-data circuit electrically connected to a column-data line and a column-data line contact pad; and a plurality of serially connected row-select circuits disposed on the tile substrate at least partially in the pixel area and between at least two pixels, each row-select circuit electrically connected to a row-select line and a row-select line contact pad; and a system controller electrically connected to each of the plurality of corner tiles.

* * * * *